United States Patent
Waltari et al.

(10) Patent No.: US 8,917,124 B1
(45) Date of Patent: Dec. 23, 2014

(54) FREQUENCY MULTIPLIER JITTER CORRECTION

(71) Applicant: IQ-Analog Corporation, San Diego, CA (US)

(72) Inventors: Mikko Waltari, Escondido, CA (US); Michael Kappes, San Diego, CA (US); William Huff, San Diego, CA (US)

(73) Assignee: IQ-Analog Corporation, San Diego, CA (US)

( * ) Notice: Subject to any disclaimer, the term of this patent is extended or adjusted under 35 U.S.C. 154(b) by 0 days.

(21) Appl. No.: 14/503,656

(22) Filed: Oct. 1, 2014

Related U.S. Application Data

(63) Continuation of application No. 14/081,568, filed on Nov. 15, 2013, now Pat. No. 8,878,577, which is a continuation-in-part of application No. 13/603,495, filed on Sep. 5, 2012, now Pat. No. 8,654,000.

(51) Int. Cl.
  *H03L 7/06* (2006.01)
  *H03L 7/091* (2006.01)
  *H03L 7/093* (2006.01)
  *H03L 7/097* (2006.01)

(52) U.S. Cl.
  CPC ............... *H03L 7/091* (2013.01); *H03L 7/093* (2013.01); *H03L 7/097* (2013.01); *H03L 2207/50* (2013.01); *H03L 2207/10* (2013.01)
  USPC ............ 327/147; 327/150; 327/149; 327/156

(58) Field of Classification Search
  USPC ............... 327/141, 144–163; 331/15–17; 375/373–376
  See application file for complete search history.

(56) References Cited

U.S. PATENT DOCUMENTS

| | | | | |
|---|---|---|---|---|
| 5,563,596 A | * | 10/1996 | Snyder et al. | 341/131 |
| 5,867,542 A | * | 2/1999 | Iwamatsu et al. | 375/354 |
| 7,126,511 B2 | * | 10/2006 | Draxelmayr et al. | 341/136 |
| 7,250,885 B1 | * | 7/2007 | Nairn | 341/141 |
| 2006/0232460 A1 | * | 10/2006 | Huang et al. | 341/155 |

* cited by examiner

*Primary Examiner* — Brandon S Cole
(74) *Attorney, Agent, or Firm* — Law Office of Gerald Maliszewski; Gerald Maliszewski

(57) ABSTRACT

A system and method are provided for frequency multiplication jitter correction. The method accepts an analog reference signal having a first frequency, and using the analog reference signal, derives a system clock signal having a second frequency, greater than the first frequency. A PLL using a voltage controlled oscillator (VCO) is one example of a frequency multiplier. The method samples the amplitude of the analog reference signal using the system clock signal and converts the sampled analog reference signal into a digitized reference signal. In response to comparing the digitized reference signal to an ideal digitized reference signal, the phase error correction for the system clock signal is derived. The phase error correction at a first instance of time can be applied to the digitized data signal, previously converted from an analog data signal sampled at a first instance of time with the system clock signal.

24 Claims, 16 Drawing Sheets

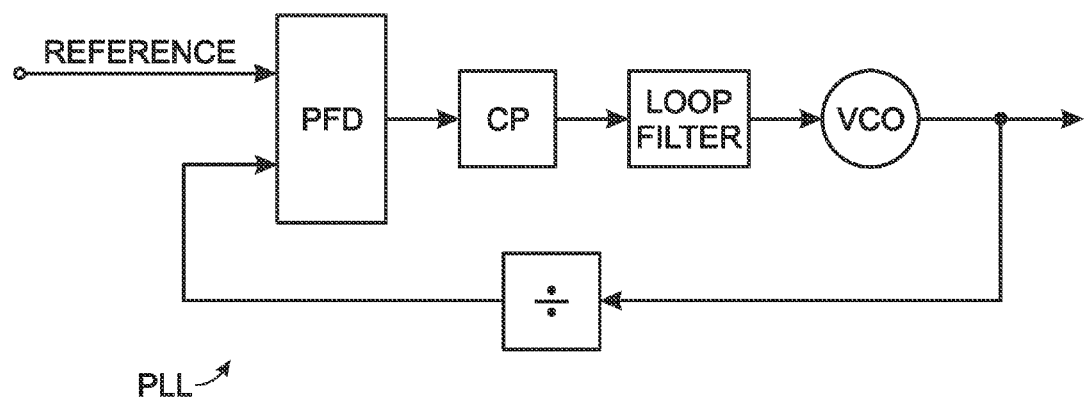
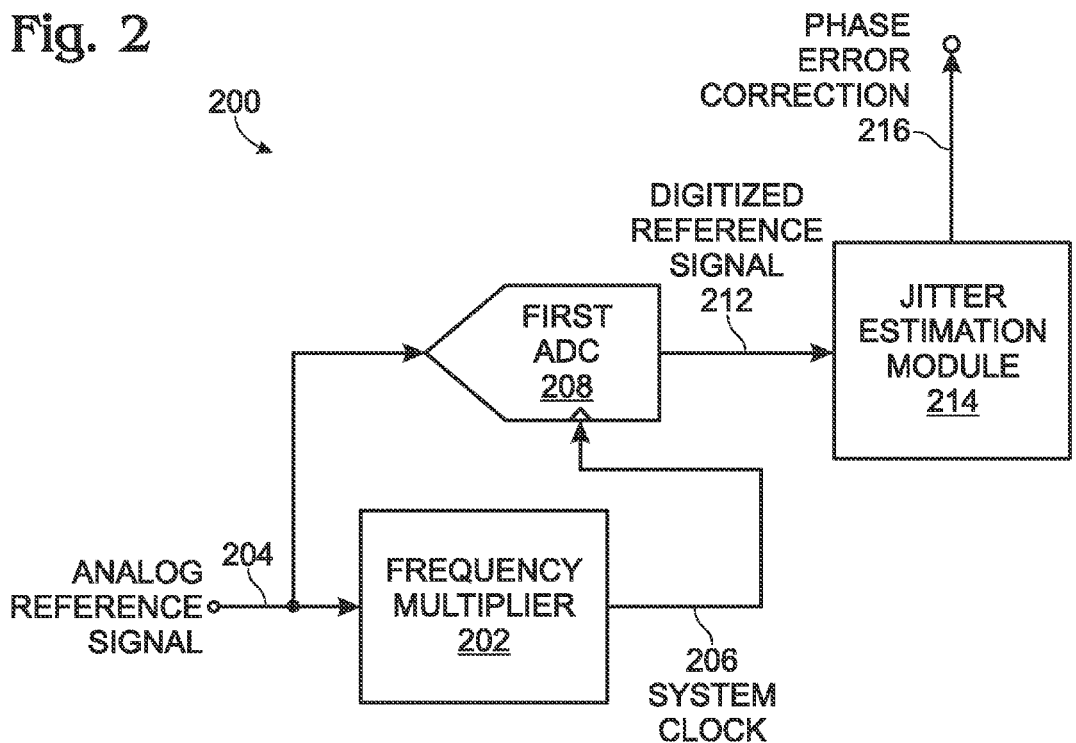

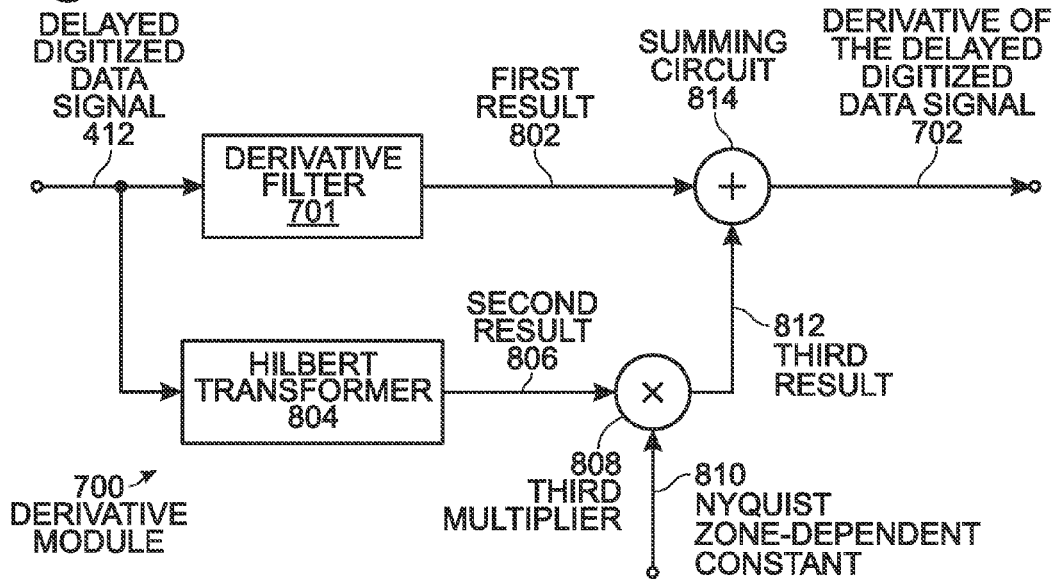
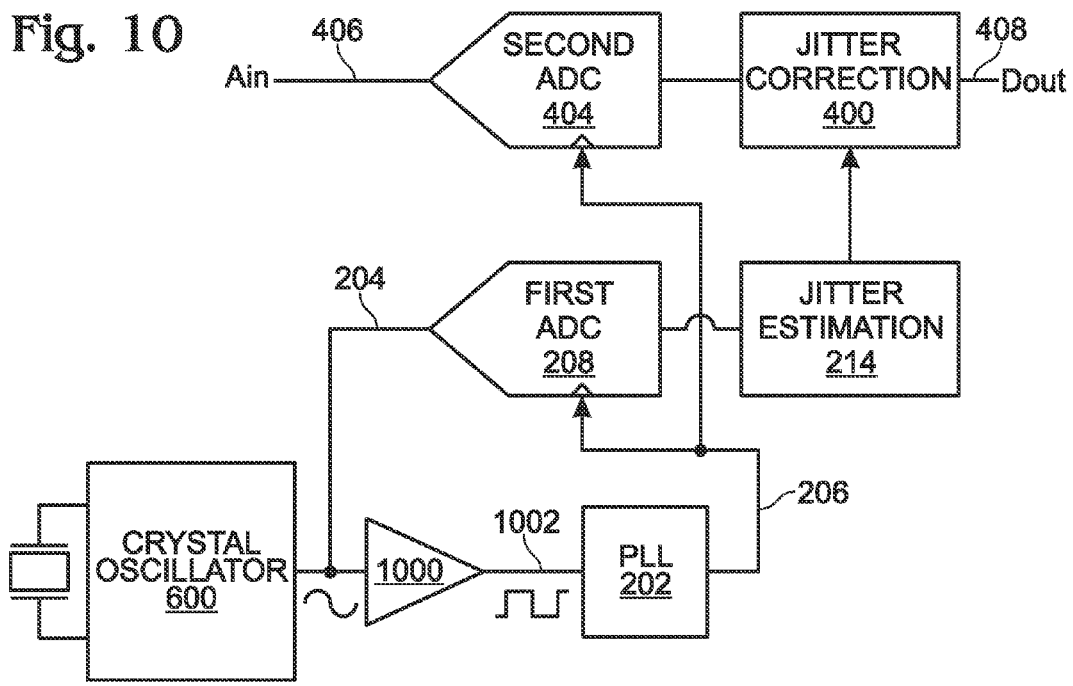

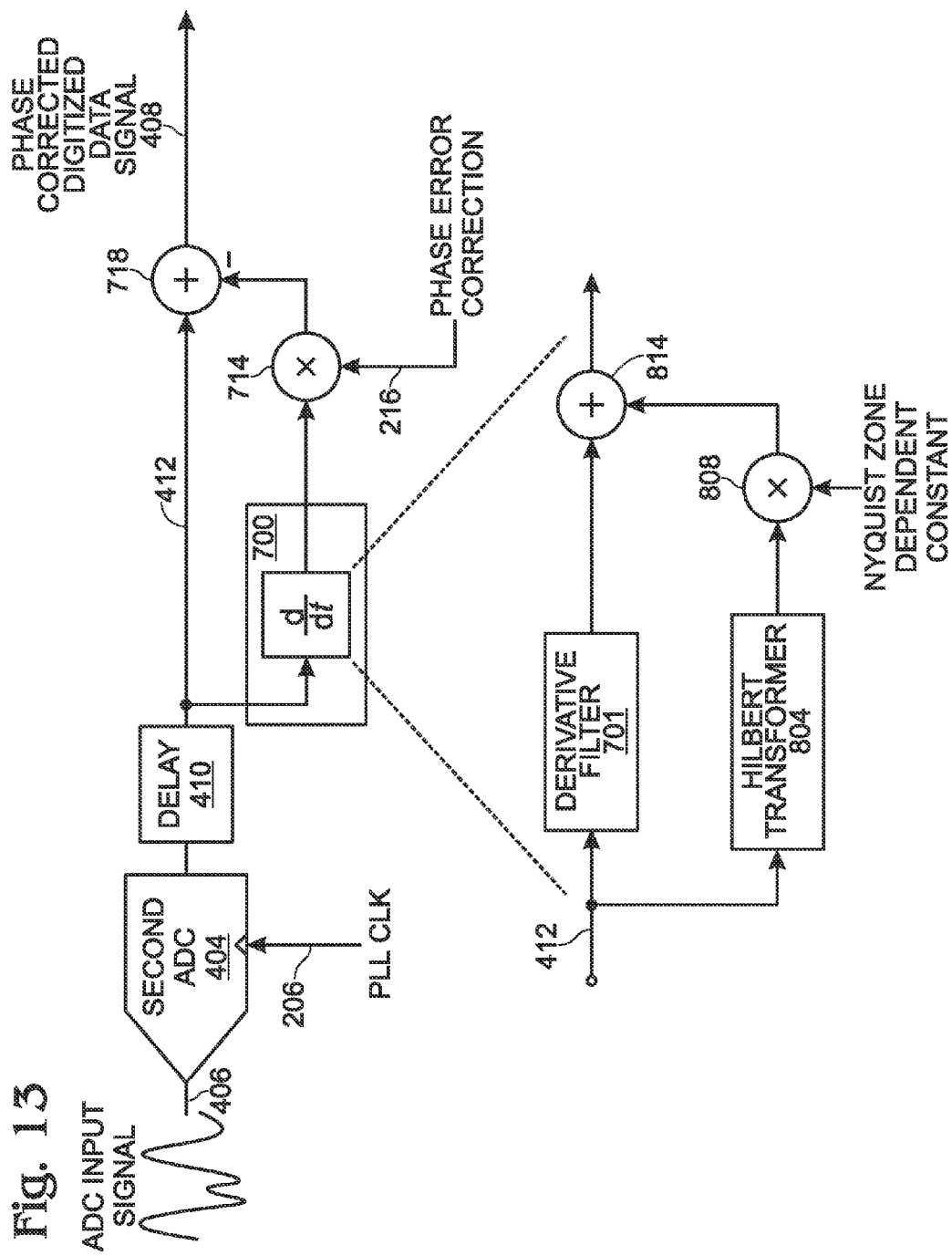

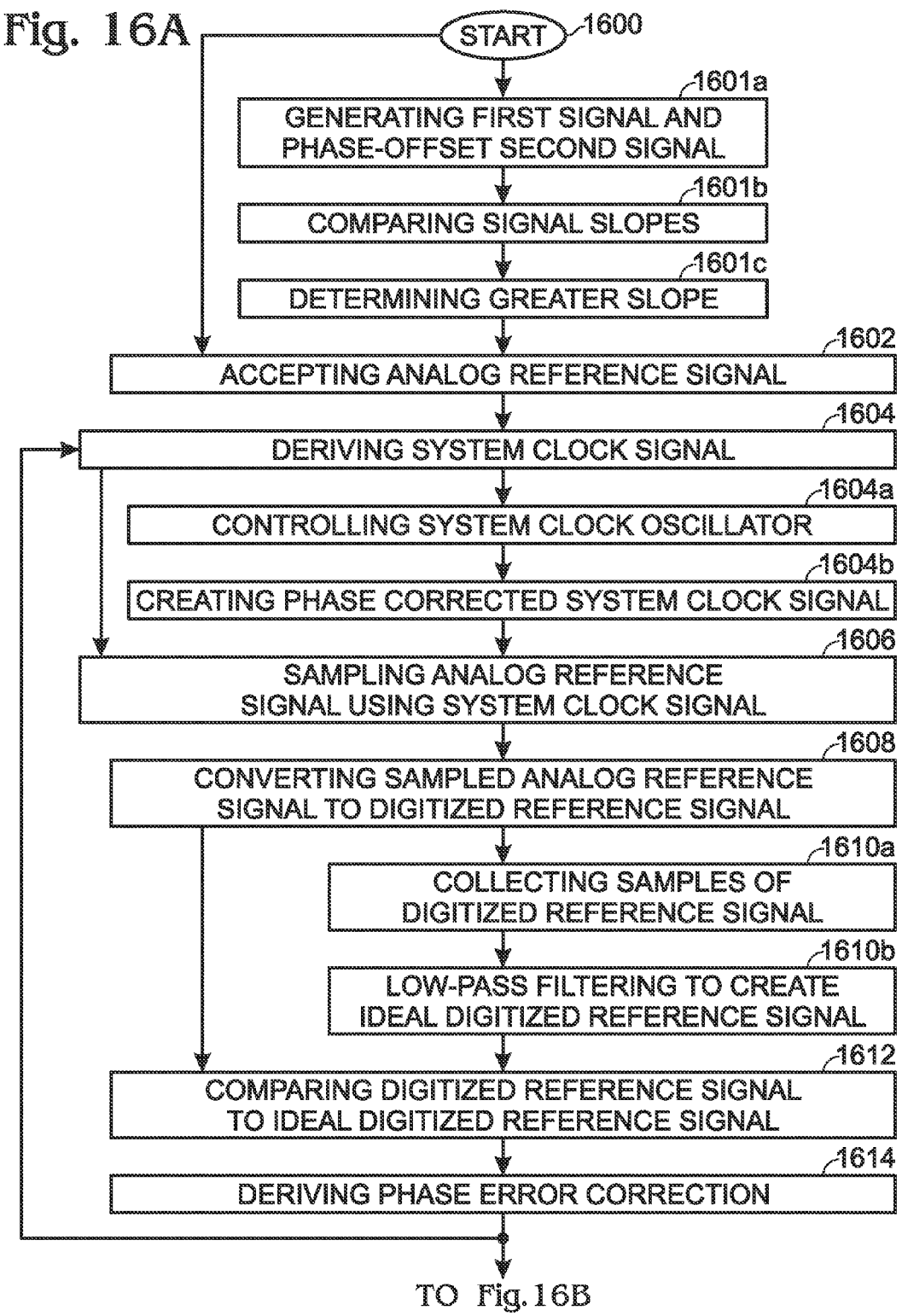

FREQUENCY MULTIPLIER JITTER CORRECTION

RELATED APPLICATIONS

This application is a Continuation of an application entitled, SYSTEM AND METHOD FOR FREQUENCY MULTIPLIER JITTER CORRECTION, invented by Mikko Waltari, Ser. No. 14/081,568, filed Nov. 15, 2013;

which is a Continuation-in-Part of an application entitled, TIME-INTERLEAVED ANALOG-TO-DIGITAL CONVERTER FOR SIGNALS IN ANY NYQUIST ZONE, invented by Mikko Waltari, Ser. No. 13/603,495, filed Sep. 5, 2012, issued as U.S. Pat. No. 8,654,000, on Feb. 18, 2014. Both these applications are incorporated herein by reference.

BACKGROUND OF THE INVENTION

1. Field of the Invention

This invention generally relates to analog-to-digital signal conversion and, more particularly, to a system and method for correcting phase errors in a synthesized frequency multiplier clock signal.

2. Description of the Related Art

FIG. 1 depicts a phase-locked loop (PLL) consisting of a phase frequency detector (PFD), a voltage controlled oscillator (VCO), a charge pump (CP), and a loop filter placed into the forward path of a negative feedback closed loop configuration (prior art). The charge pump converts the pulse width modulated output voltage of the PFD into current pulses. The amplitude of the current is often made to track some static or almost static parameter such as the manufacturing process, temperature, and supply voltage. It can also be varied with the output frequency of the PLL. The VCO runs at the desired output clock frequency, or some multiple of it. Due to fundamental limitations the VCO itself is not inherently accurate or stable. To obtain a stable and accurate output frequency the VCO is enclosed in a feedback loop, where the output frequency is divided down and compared to a much lower frequency reference clock typically produced by a crystal oscillator. The loop locks the divided down VCO output to the reference frequency, resulting a stable output frequency that is an integer (N) multiple of the reference frequency.

A linear or harmonic type VCO includes a varactor whose capacitance is responsive to the input control voltage, and is used to change the capacitance in an inductor-capacitor (LC) tank circuit or crystal resonator. A delay-based ring VCO operates using gain stages connected in a ring, with the output frequency being a function of the delay in each of stages.

Another type of frequency multiplier is the digital PLL, which operates in much the same manner as a PLL, except that the VCO is replaced by a digitally controlled oscillator (DCO) that runs at the required clock frequency, or some multiple, in response to digital input control signals supplied by a digital phase frequency detector. Still another frequency multiplier is a delay-locked loop (DLL), which has a controlled delay line that is voltage or digitally controlled. The DLL generates a plurality of phase shifted versions of the reference clock that are combined to produce a new clock signal that is a multiple of the reference frequency.

The most common type of reference source is a crystal oscillator, which relies upon the inherent stability of quartz crystal to provide a reference frequency that remains constant within a few parts per million. Microelectromechanical system (MEMS) resonators are small electromechanical structures that vibrate at high frequencies. For frequency and timing references, MEMS resonators are attached to sustaining amplifiers, to drive them in continuous motion and produce output reference signals. MEMS oscillators can be fabricated as multi-pin integrated circuits (ICs) to supply multiple signal phases.

The sampling clock for an analog-to-digital converter (ADC) is often generated using a PLL. Typically, the jitter of the sampling clock is dominated by the close-in phase noise of the PLL, especially when a ring oscillator type VCO is used. The clock jitter is one of the main limitations to the ADC signal-to-noise ratio (SNR) when sampling a high-frequency input signal. A crystal oscillator can provide a reference signal with a minimum of phase noise, but the available frequencies are too low for many applications.

One limitation, especially when the ratio of the output frequency to the reference frequency is large, is that the VCO must run many cycles between the generation of any correction information from phase comparisons with the reference signal, which occurs only once in the reference period. Between the feedback pulses (control signals to the VCO) at the rate of the reference frequency, the output phase can drift due to device noise or some external disturbance. To keep the feedback loop stable, the amount of correction that can be applied at a single reference period is also limited by the bandwidth of the loop-filter, which further delays the phase error correction. As a result, there is a limit to how much of the VCO phase noise the feedback loop can correct.

It would be advantageous if a method existed that provided an improvement in the phase noise correction possible in a system using phase-locked system clock.

SUMMARY OF THE INVENTION

Disclosed herein are a system and method to estimate the instantaneous phase error of a frequency multiplier, such as a phase-locked loop (PLL) output clock, and use this estimate to digitally suppress the resultant sampling error from an analog-to-digital (ADC) output. Phase error corrections are made by comparing the frequency multiplier output to reference signal at multiple instances within a reference signal period. These phase error corrections are applied in a feed-forward manner to the sampled ADC output.

Accordingly, a method is provided for frequency multiplication jitter correction. The method accepts an analog reference signal having a continuous amplitude, continuous phase information, and a first frequency. Using the analog reference signal, a system clock signal is derived having a second frequency, greater than the first frequency. A PLL using a voltage controlled oscillator (VCO) is one example of a frequency multiplier. The method samples the continuous amplitude (e.g., sine wave) of the analog reference signal using the system clock signal and converts the sampled analog reference signal into a digitized reference signal. In response to comparing the digitized reference signal to an ideal digitized reference signal, a phase error correction is derived for the system clock. If the amplitude of an analog data signal is sampled at the first instance of time with a system clock signal and converted into a digitized data signal, then the phase error correction derived at the first instance of time can be applied to the digitized data signal.

The ideal digitized reference signal is created by collecting samples of the digitized reference signal over a plurality of digitized reference signal periods, at a plurality period reference points, and low-pass filtering the collected samples of the digitized reference signal period reference point samples. More explicitly, the phase error correction is found by subtracting the ideal digitized reference signal from the digitized reference signal to supply a difference signal. Then, the phase error correction is derived by finding an inverse of a derivative of the ideal digitized reference signal, and multiplying the difference signal by the inverse of the derivative.

When the analog data signal is inside the first Nyquist zone, the phase error correction is applied to a delayed digitized data signal by finding the derivative of the delayed digitized data signal, and multiplying the derivative of the delayed digitized data signal by the phase error correction to supply a product. Then, the product is subtracted from the delayed digitized data signal. When the analog data signal is outside of the first Nyquist zone, the derivative of delayed digitized data signal creates a first result and a Hilbert transformation is performed on the delayed digitized data signal to supply a second result. The second result is multiplied by a Nyquist zone-dependent constant to supply a third result and summed with the first result to supply a product that is subtracted from the delayed digitized data signal.

In other aspects, the phase error correction can be used to control a programmable delay in the system clock signal, so as to create a phase corrected system clock signal. As another alternative, the phase error correction can be supplied to the frequency multiplier and used as a control signal to modify the phase of the system clock oscillator supplying the system clock signal.

Additional details of that above-described method and a system for frequency multiplier jitter correction are provided below.

BRIEF DESCRIPTION OF THE DRAWINGS

FIG. 1 depicts a phase-locked loop (PLL) consisting of a phase frequency detector, a voltage controlled oscillator (VCO), a charge pump (CP), and a loop filter placed into the forward path of a negative feedback closed loop configuration (prior art).

FIG. 2 is a schematic block diagram of a system for frequency multiplier jitter correction.

FIG. 8 is a schematic block diagram of the derivative module of FIG. 7 in the case where the analog data signal is outside of the first Nyquist zone, with a frequency of greater than $f_S/2$.

FIG. 10 depicts the system of FIG. 4 from a slightly different perspective.

FIG. 13 depicts an example of the jitter correction module.

FIGS. 16A and 16B are flowcharts illustrating a method for frequency multiplication jitter correction.

DETAILED DESCRIPTION

FIG. 2 is a schematic block diagram of a system for frequency multiplier jitter correction. The system 200 comprises a frequency multiplier 202 with an input on line 204 to accept an analog reference signal having a first frequency, and an output on line 206 to supply a system clock signal having a second frequency, greater than the first frequency. For example, the frequency multiplier 202 may be a phase-locked loop (PLL) or a delay-locked loop (DLL). As used herein, an analog signal is continuous in amplitude and phase, while a digital or digitized signal is quantized in amplitude and phase. The system clock signal, especially when used as an analog sampling clock, is quantized (using two levels) in amplitude, but continuous in phase.

A first analog-to-digital converter (ADC) 208 has a signal input on line 204 to accept the analog reference signal, a clock input on line 206 to accept the system clock signal, and an output on line 212 to supply a digitized reference signal in response to sampling the amplitude of the analog reference signal using the system clock signal. The analog signal amplitude being sampled may be either a current or voltage amplitude. A jitter estimation module 214 has an input on line 212 to accept the digitized reference signal. The jitter estimation module 214 compares the digitized reference signal to an ideal digitized reference signal. In response to the comparing, the jitter estimation module 214 determines a phase error in the system clock signal and supplies a phase error correction on line 216.

Figure 3:
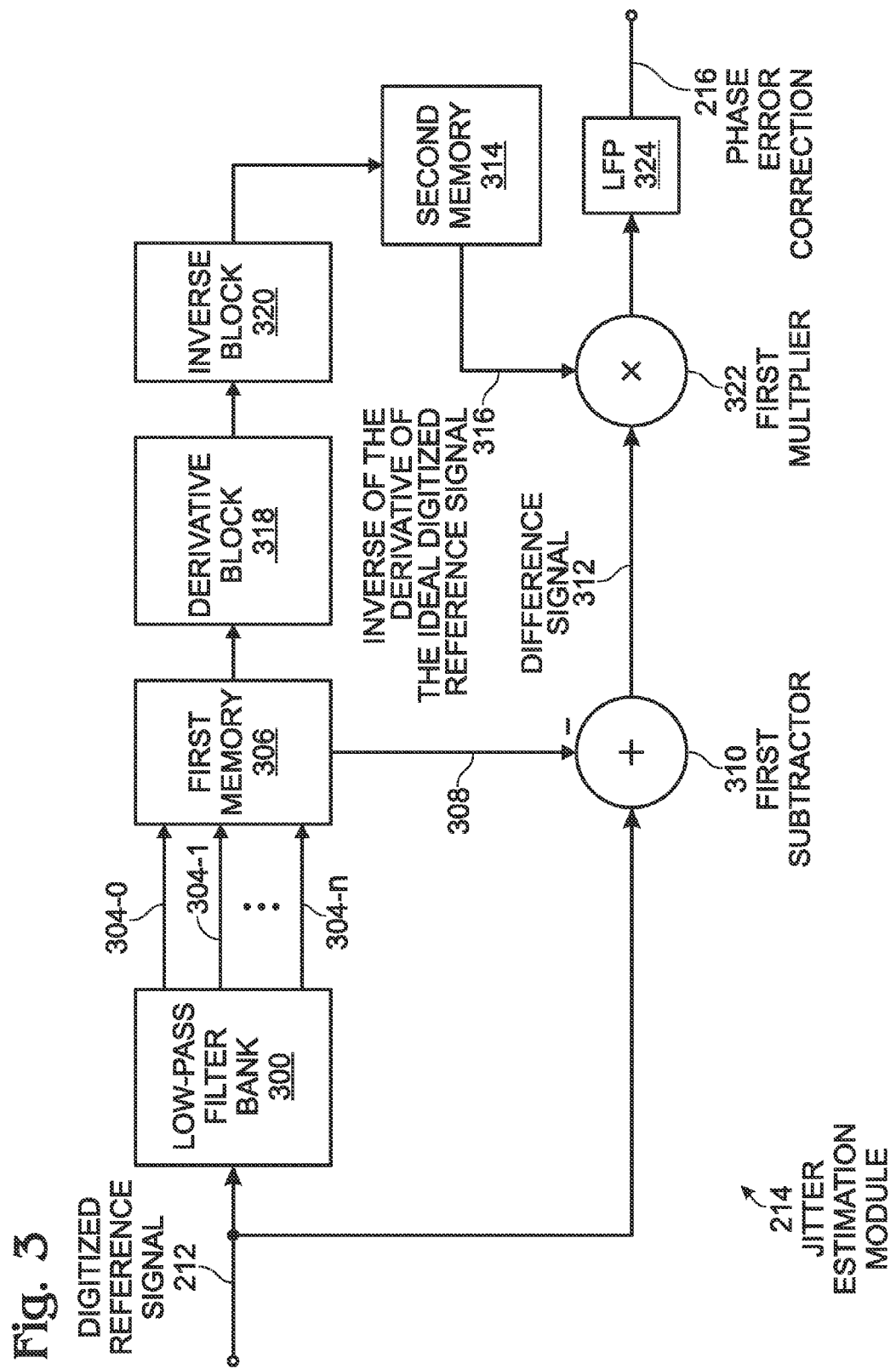
FIG. 3 is a schematic block diagram depicting details of the jitter estimation module.

FIG. 3 is a schematic block diagram depicting details of the jitter estimation module. In one aspect, the jitter estimation module 214 comprises a low-pass filter bank 300 with an input on line 212 to accept the digitized reference signal. The low-pass filter bank 300 samples the digitized reference signal over a plurality of digitized reference signal periods at a plurality of period reference points. The low-pass filter bank 300 has outputs on lines 304-0 through 304-n to supply the ideal digitized reference signal, where n is an integer greater than one, but otherwise not limited to any particular value. For example, n may be equal to 3 and the period reference points may be the amplitude of the digitized reference signal at the phases of 0, 90, 180, and 270 degrees, averaged over may cycles of the digitized reference signal. A more explicit implementation of the low-pass filter bank 300 is provided below. A variety of low-pass filtering algorithms are known in the art may be used to enable the low-pass filter bank 300. Once such algorithm is the moving average filter.

Figure 4:
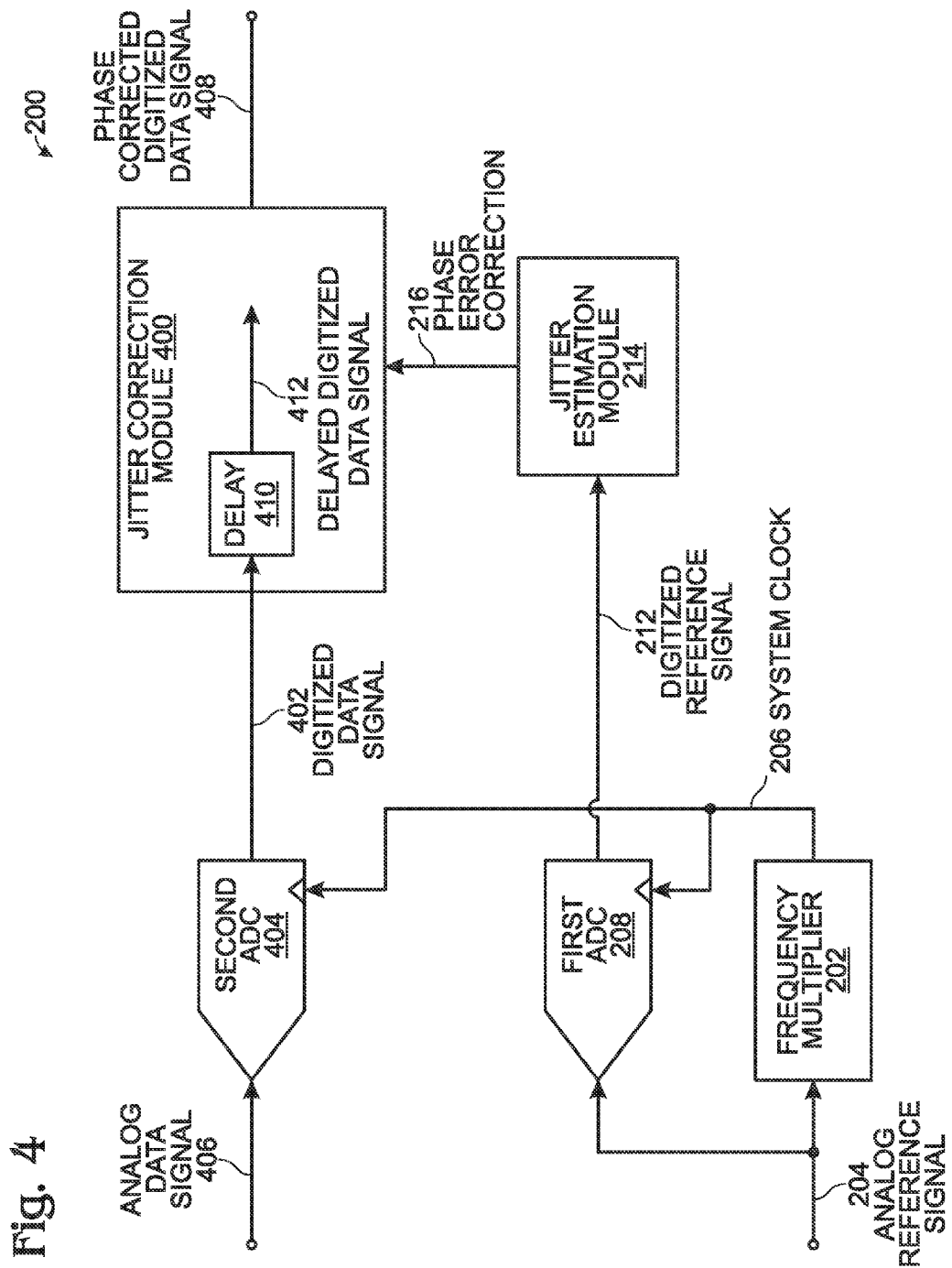
FIG. 4 is a schematic block diagram of the system of FIG. 2 featuring additional details.

FIG. 4 is a schematic block diagram of the system of FIG. 2 featuring additional details. In this aspect, the jitter estimation module 214 determines the phase error in the system clock at a first instance of time and supplies the phase error correction on line 216. The system 200 further comprises a jitter correction module 400 having a first input to accept a digitized data signal on line 402 and a second input to accept the phase error correction on line 216. A second ADC 404 has a signal input on line 406 to accept an analog data signal at the first instance of time, and a clock input to accept the system clock signal on line 206. The second ADC 404 has an output on line 402 to supply the digitized data signal in response to sampling the amplitude of the analog data signal with the system clock signal. Again, the amplitude being sampled may be a current or voltage amplitude. Further, the second ADC 404 need not necessarily be the same type of ADC as the first ADC 208. The jitter correction module 400 applies the phase error correction to the digitized data signal and supplies a phase corrected digitized data signal at an output on line 408.

Some of the types of ADCs from which the first ADC 208 and second ADC 400 may be selected include direct-conversion (flash), successive approximation, ramp-compare, integrating (dual or multi-slope), pipelined, oversampling, and time-interleaved ADCs. Other types of ADCs may exist, and the system 200 is not limited to any particular type or types of ADCs.

The jitter estimation module 214 supplies the phase error correction on line 216 within a duration of time no greater than a first processing time. The jitter correction module 400 applies the phase error correction within a duration of time no greater than a second processing time. Therefore, the jitter correction module 400 may further comprise a delay 410 having an input on line 402 to accept the digitized data signal and an output on line 412 supply a delayed digitized data signal, delayed a first duration of time equal to the sum of the first and second processing times. Then, the jitter correction module 400 applies the phase error correction to the delayed digitized data signal.

Figure 5:
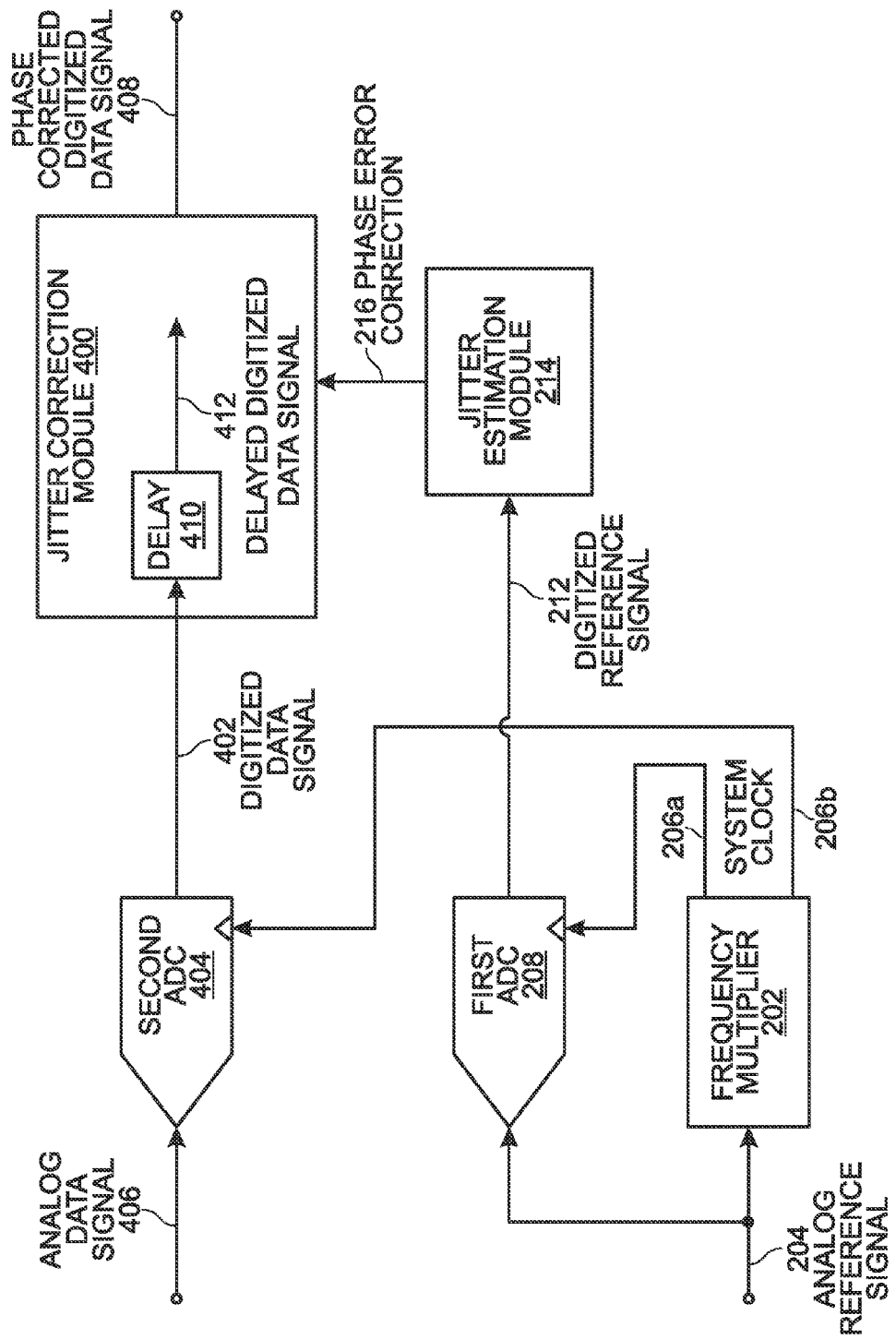
FIG. 5 is a schematic block diagram depicting a variation of the system described by FIG. 4.

FIG. 5 is a schematic block diagram depicting a variation of the system described by FIG. 4. In this aspect, the frequency multiplier 200, in addition to supplying the system clock signal with the second frequency on line 206a, supplies a system clock signal on line 206b having a third frequency, different than the first and second frequencies, derived from the analog reference signal on line 204. The first ADC 208 samples the analog reference signal on line 204 with the system clock signal having the second frequency, but the second ADC 404 samples the analog data signal on line 406 with the system clock having the third frequency.

Figure 6:
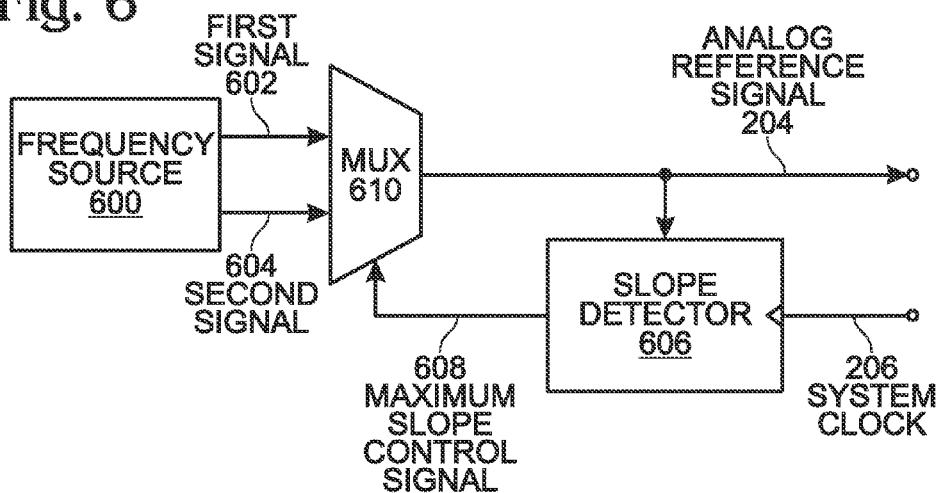
FIG. 6 is a schematic block diagram depicting an exemplary frequency source with analog reference frequency slope control.

FIG. 6 is a schematic block diagram depicting an exemplary frequency source with analog reference signal slope control. In this aspect a frequency source 600 is shown with a first output on line 602 to supply a first signal having the first frequency, and a second output on line 604 to supply a second signal having the first frequency and a constant phase offset with respect to the first signal. The frequency source 600 may typically be a crystal oscillator (XO) or a microelectromechanical system (MEMS) oscillator, but the system is not limited to any particular type of frequency source.

A multiplexer (MUX) 610 has inputs connected to the first and second outputs of the frequency source, respectively, on lines 602 and 604. The MUX 610 has an output on line 204 to supply the analog reference signal in response to the maximum slope control signal on line 608 received at a control port. A slope detector 606 has an input on line 204 to sample the first signal over a plurality of first signal periods and the second signal over a plurality of second signal periods. The slope detector 606 compares the collected samples of the slope of the first signal to the collected samples of the slope of the second signal and determines the signal having the greater slope at a plurality of period reference points. The slope detector 606 supplies a maximum slope control signal at an output on line 608 in response to the comparison of the first and second signal slopes. For example, if the analog reference signal has four period reference points, the MUX 610 may select the first and third samples from the first signal and second and fourth samples from the second signal as the supplied analog reference signal on line 204. Once collected by the slope detector 606, this slope comparison data may be stored in memory (not shown). The slope detector 606 may be clocked or triggered using the system clock on line 206, but alternatively, other trigger sources may be used. In other aspects not shown, the greatest slope from more than two input signals can be used as the analog reference signal.

Returning the FIG. 3, the jitter estimation module 214 further comprises a first memory 306 to supply the ideal digitized reference signal on line 308 from storage. A first subtractor 310 has an input on line 308 to accept the ideal digitized reference signal from the first memory 306, an input on line 212 to accept the digitized reference signal, and an output on line 312 to supply a difference signal. A second memory 314 supplies the inverse of the derivative of the ideal digitized reference signal from storage on line 316. The operation of taking the derivation of the ideal digitized reference signal is performed by derivative block 318, and the operation of taking the inverse of the derivative is performed by inverse block 320. These operations may be performed by the jitter estimation module 214 (as shown), or optionally, by a processor located outside the jitter estimation module, or even by a processor outside the frequency multiplier jitter correction system. It should also be noted that the operations of finding the ideal digitized reference signal and the inverse derivative of the ideal digitized reference signal may only be performed upon initial calibration or periodically, permitting these results to be stored in memory. More typically, the ideal digitized reference signal is continuously updated to cancel any drift in the analog reference signal, even if the drift is not large enough to have a significant effect on the derivative.

A first multiplier 322 has an input on line 312 to accept the difference signal, an input to accept the inverse of the derivative of the ideal digitized reference signal from the second memory on line 316, and an output to supply the phase error correction. In one aspect, the jitter estimation module 214 further comprises a low-pass filter (LPF) 324 having an input connected to the output of the first multiplier 322 and an output on line 216 to supply a phase error correction that has been filtered. The low-pass filter 324 may be enabled as a finite impulse response (FIR) filter, but the system is not limited to any particular means of low-pass filtering.

Figure 7:
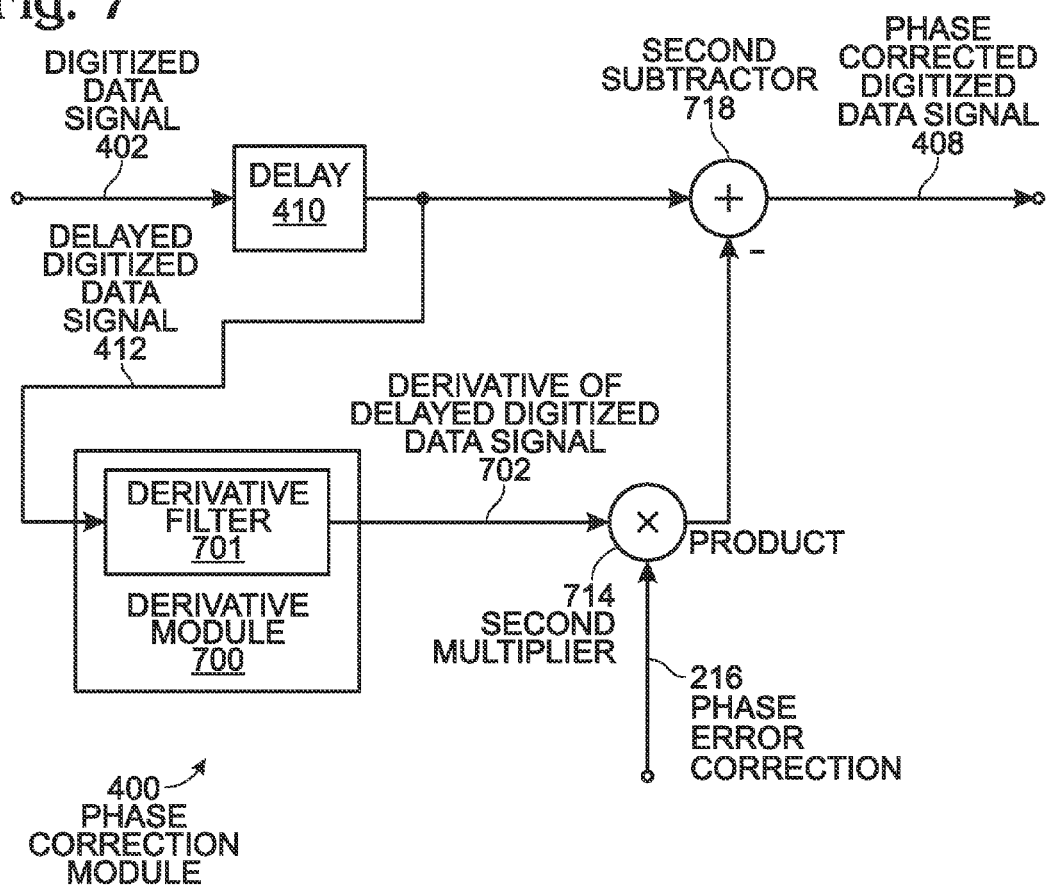
FIG. 7 is a block diagram depicting the jitter correction module in greater detail.

FIG. 7 is a block diagram depicting the jitter correction module in greater detail. In this aspect the jitter correction module 400 further comprises a derivative module 700 comprising a derivative filter 701. When the analog data signal is within the first Nyquist zone, the derivative filter 701 accepts the delayed digitized data signal at an input on line 412 and supplies a derivative of the delayed digitized data signal on line 712. The analog data signal is in the first Nyquist zone if it has a frequency of less than one-half the frequency of the system clock by which it is being sampled. Alternatively stated, if the system clock frequency is $f_S$, the first Nyquist zone is the band of analog data signal frequencies between 0 and $f_S/2$. A second multiplier 714 has an input on line 712 to accept the derivative of the delayed digitized data signal, an input to accept the phase error correction on line 216, and an output to supply a product on line 716. A second subtractor 718 has an input to accept the delayed digitized data signal on line 412, an input on line 716 to accept the product for subtraction from the delayed digitized data signal, and an output on line 408 to supply the phase corrected digitized data signal.

FIG. 8 is a schematic block diagram of the derivative module of FIG. 7 in the case where the analog data signal is outside of the first Nyquist zone, with a frequency of greater than $f_S/2$. In this case, the derivative filter 701 accepts the delayed digitized data signal on line 412 and supplies a first result on line 802. A Hilbert transformer 804 has an input to accept the delayed digitized data signal on line 412 and an output on line 806 to supply a second result. The Hilbert transformer changes the phase of the input signal by 90 degrees. Both the derivative filter 701 and Hilbert transformer 804 may be enabled as FIR filters, as would be familiar to those skilled in the art of digital signal processing. However, the system is not limited to any particular means of taking a derivative or changing the phase of a signal. A third multiplier 808 has an input on line 806 to accept the second result, an input on line 810 to accept a Nyquist zone-dependent constant, and an output on line 812 to supply a third result. A summing circuit 814 has an input on line 802 to accept the first result, an input on line 812 to accept the third result, and an output on line 702 to supply the derivative of the delayed digitized data signal. The Nyquist zone-dependent constant may be described as: $(-1)^k \lfloor k/2 \rfloor \pi$, where integer k represents the Nyquist zone (1 for the first zone, 2 for the second zone, and so on) and the brackets ($\lfloor \; \rfloor$) denote rounding towards zero.

The above-described elements of the jitter estimation and jitter correction modules may be enabled in hardware using complementary and hardwired state machine logic, in software using a processor enacting a sequence of instructions stored in a non-transitory memory, or with a combination of hardware and software using a field programmable gate array (FPGA) for example.

Figure 9:
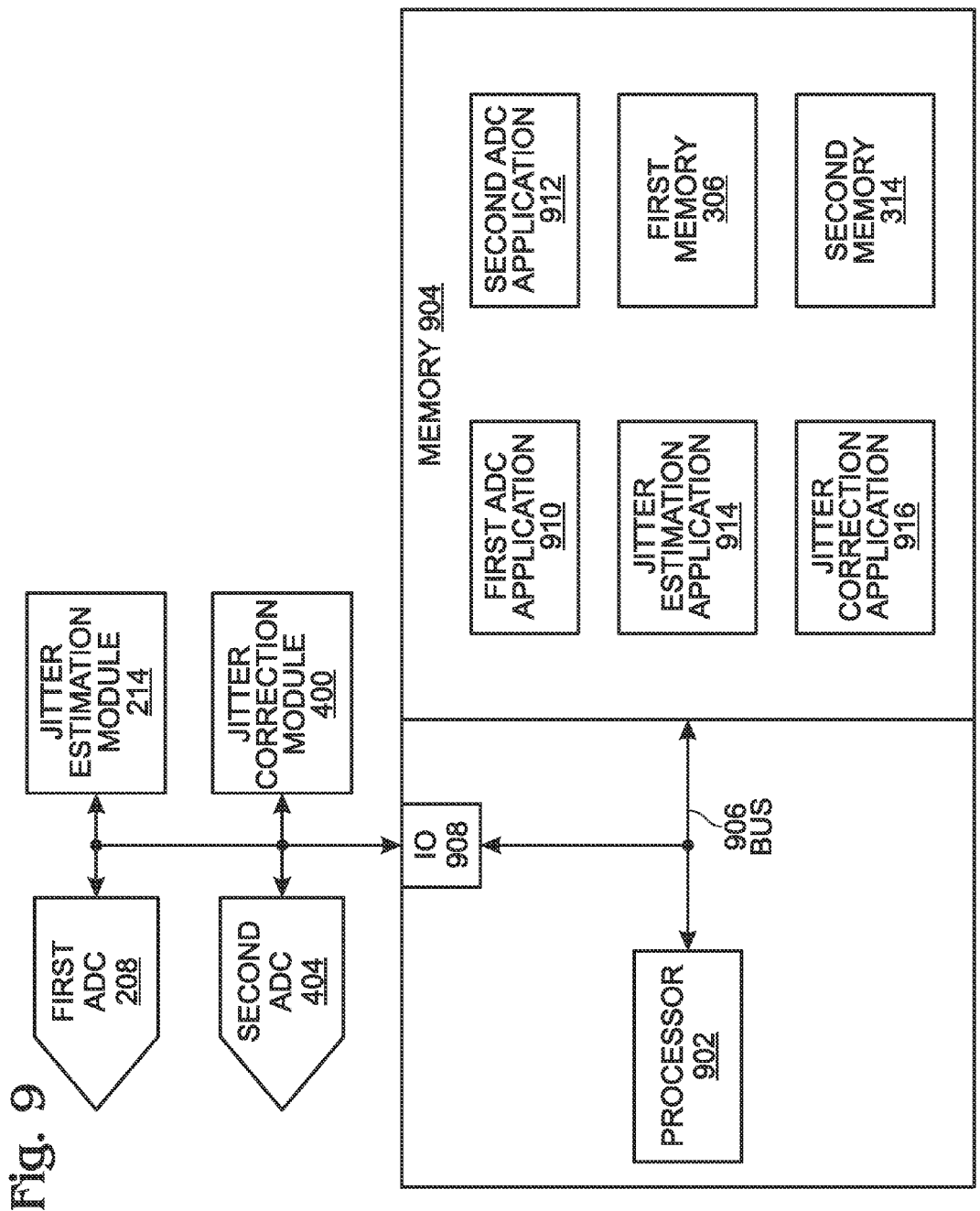
FIG. 9 is a schematic block diagram of a computer that may be used to enable all or some portions of ADCs, jitter estimation module, and jitter correction module.

FIG. 9 is a schematic block diagram of a computer that may be used to enable all or some portions of ADCs, jitter estimation module, and jitter correction module. The computer 900 comprises a processor 902 connected to a non-transitory memory 904 via data/address bus 906. For the sake of simplicity, the bus 906 is shown connected to the first ADC 208, second ADC 404, jitter estimation module 214, and jitter correction module 400 via an input/output (IO) interface 908. The IO interface 908 may be enabled using one or more communication protocols known in the art. The memory 904 includes a first ADC application 910, a second ADC application 912, a jitter estimation application 914, and a jitter correction application 916. The applications are sequences of software instructions that are enacted by the processor 902 to perform various functions. The memory may also include the first memory 306 and second memory 314 associated with the jitter estimation module. For example, the first and second ADC applications 910/912 may include instructions for an ADC that performs oversampling or interleaving. The jitter estimation application 914 may perform functions associated with the low-pass filter and low-pass filter bank, first subtractor, and first multiplier, as well as functions associated with the derivative and inverse blocks. Likewise, the jitter correction module 916 may perform functions associated with the delay, derivative filter, second multiplier, third multiplier, summing circuit, and second subtractor.

FIG. 10 depicts the system of FIG. 4 from a slightly different perspective. The above-described system is based on the fact that if the reference comparison can be performed more often, ideally at every output clock period, the phase error can be better corrected. In a PLL using a digitized reference signal on line 1002, this is even more difficult since the digitized reference signal is a two level signal and contains phase information only at the transitions, twice in the clock period. However, a crystal oscillator 600 produces an analog reference frequency on line 204 in nearly a sinusoidal form before it is squared up and buffered by device 1000. Note: buffer device 1000 may be part of a crystal oscillator having both an analog and digitized reference signal output. A sinusoidal signal carries the phase information at every time point, perhaps excluding the very peaks. Furthermore, if the phase correction can be applied in a feedforward rather than feedback manner, there are no stability constraints and a system using such phase correction information can respond much better to instantaneous phase errors.

The system uses an ADC 208 to sample the sinusoidal (or nearly sinusoidal) reference signal using the PLL output on line 206 as a sampling (system) clock. A sampling clock without any phase noise would produce a periodic ADC output signal that represents one period of the reference waveform. In the presence of PLL phase noise this same ideal curve can be estimated by averaging the signal over many reference periods. Now, every instantaneous sample of the reference clock can be compared to this nominal curve and the difference used to estimate the phase error in the PLL output. This estimate is in a digital form.

When a second ADC 404, which doesn't need to be identical, or even of the same type as the first ADC 208, is used to sample an analog input signal using the same PLL output as a sampling clock, the digital phase error estimate can be used to digitally correct the ADC 404 output values. This correction is essentially a feedforward mechanism and doesn't suffer from the stability constraints of a feedback system.

The first ADC 208 can operate at lower sampling rate than the second ADC 404 and still provide close-in phase noise suppression. The phase error estimates for the clock edges between the measured edges are based on numerical interpolation, or alternatively, the previous estimate is used for all following edges until a new estimate is available.

To improve the phase estimation at the peaks of the reference waveform, a crystal oscillator circuit with two out-of-phase (e.g. sine and cosine) output signals can be used, see FIG. 6. With a dynamically controlled MUX before the first ADC 208 (as shown in FIG. 6), or with an additional ADC and digital MUX after the first ADC (not shown), the waveform that has steeper slope can be selected for use as the analog reference signal.

Figure 11:
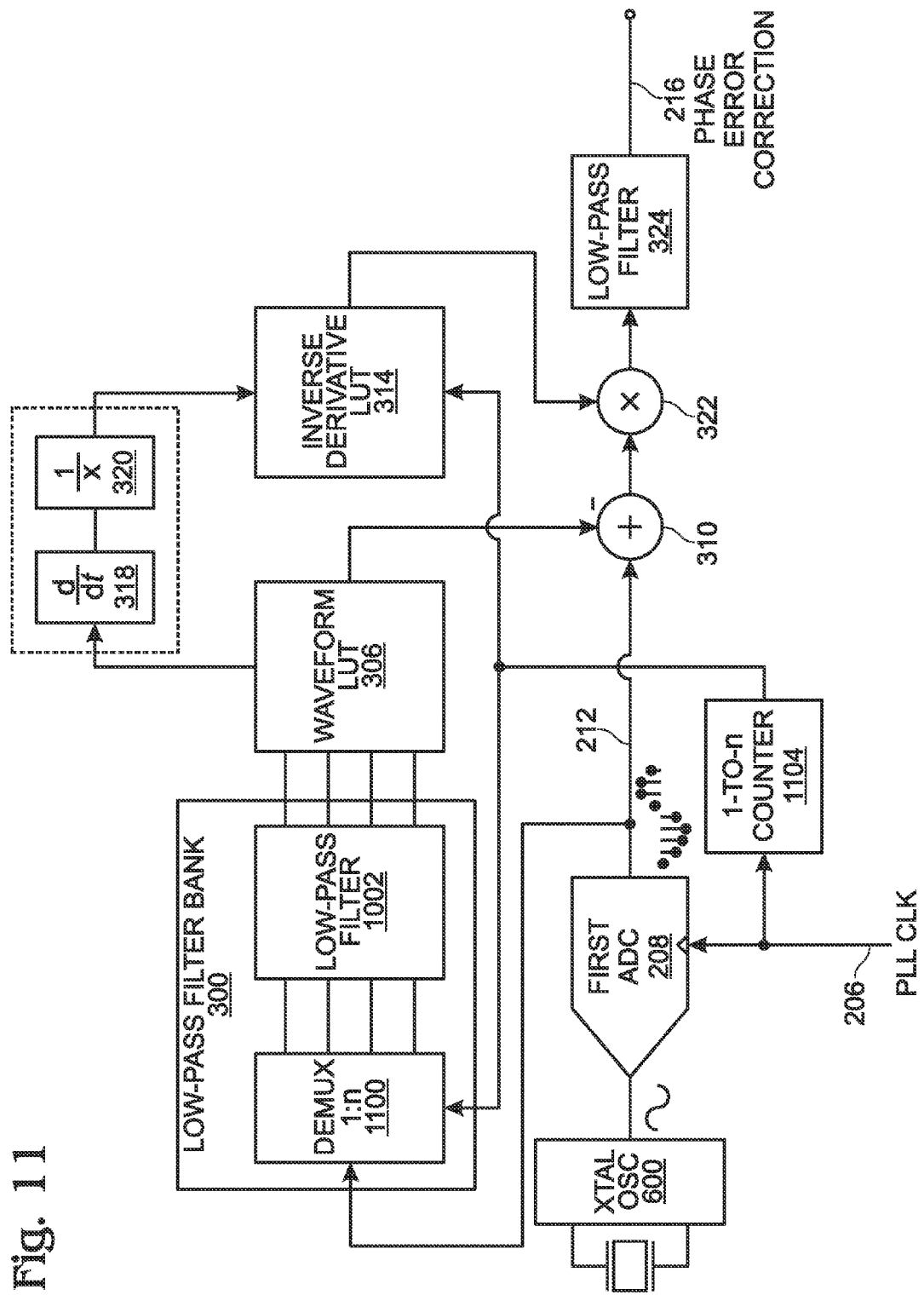
FIGS. 11 and 12 are, respectively, an exemplary block diagram of the jitter estimation module, and associated waveforms.
Figure 12:
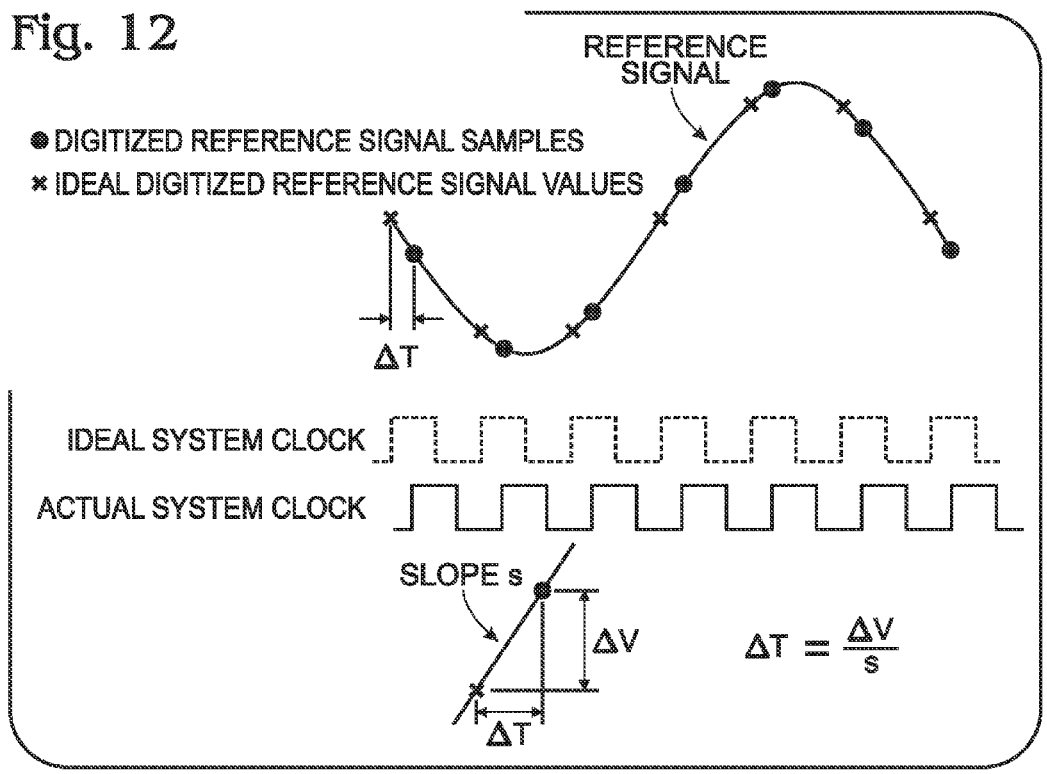

FIGS. 11 and 12 are, respectively, an exemplary block diagram of the jitter estimation module, and associated waveforms. Samples out of the first ADC 208 are demultiplexed into n parallel streams by the demultiplexer (DEMUX) 1100 of filter bank 300, each one representing one fixed point in the digitized reference waveform. The DEMUX 1100 is controlled by signals from a 1-to-n counter 1104, which is triggered by the system clock on line 206. In an ideal case the values would be constants, but in the presence of jitter in the system clock, and noise in the first ADC 208 and the oscillator 600, they are noisy. To establish the estimates of the ideal values, the data streams are filtered by a low-pass filter 1102, which is implemented with n parallel filters or with one filter that is time shared between n signal paths. The outputs of low-pass filter 1002 form the look-up-table (LUT) values in the first memory 306. These values are further used to build up a second lookup table in the second memory 314 consisting of the inverse of the derivate of the reference waveform at each sample point.

To generate the jitter estimate for each system clock edge, the expected reference waveform value, which is stored in the first lookup table 306, is first subtracted from the actual value sampled by the first ADC 208 (the digitized reference signal on line 212). This signal represents the difference between the ideal value and the actual one in the analog domain. Assuming that all of the difference is due to clock jitter, the jitter estimate can be obtained by dividing the difference value by the slope of the waveform, which is equivalent to multiplying it by the inverse of the derivative that is stored in the second lookup table in the second memory 314. Since the actual measurement contains some amplitude noise as well, the final output may be low-pass filtered by LPF 324 to give a better estimate of the close-in phase noise. Alternatively, the filtering can be performed with a band-pass filter before the first multiplier (not shown).

FIG. 13 depicts an example of the jitter correction module. Here, the second ADC 404, which uses the same PLL system clock as the jitter estimation (first) ADC, samples an arbitrary analog data waveform. After the second ADC 404, the digitized data signal is delayed to properly align it with the jitter estimate (phase error correction). The correction is accomplished by multiplying the estimate of the derivative of the ADC input signal by the jitter estimate (phase error correction), and subtracting the result from the delayed digitized data signal. If the analog data input signal on line 406 is in the first Nyquist zone, just the derivative filter 701 can be used to generate the estimate of the derivative. When the analog data signal is in other Nyquist zones, the sampling causes aliasing and the derivative obtained with a derivative filter in the digital domain is no longer a good estimate of the derivative of the analog signal. A proper estimate can be obtained with a combination of the derivative filter 701 and a Hilbert transformer 804 as shown in the figure. Additional details of the above-described derivative module 700 can be found in parent application Ser. No. 13/603,495, which is incorporated herein by reference.

Although many of the figures depict the frequency multiplier enabled as a PLL, it can also be based on a DLL for instance, and more generally, any other type of frequency multiplier.

Figure 14:
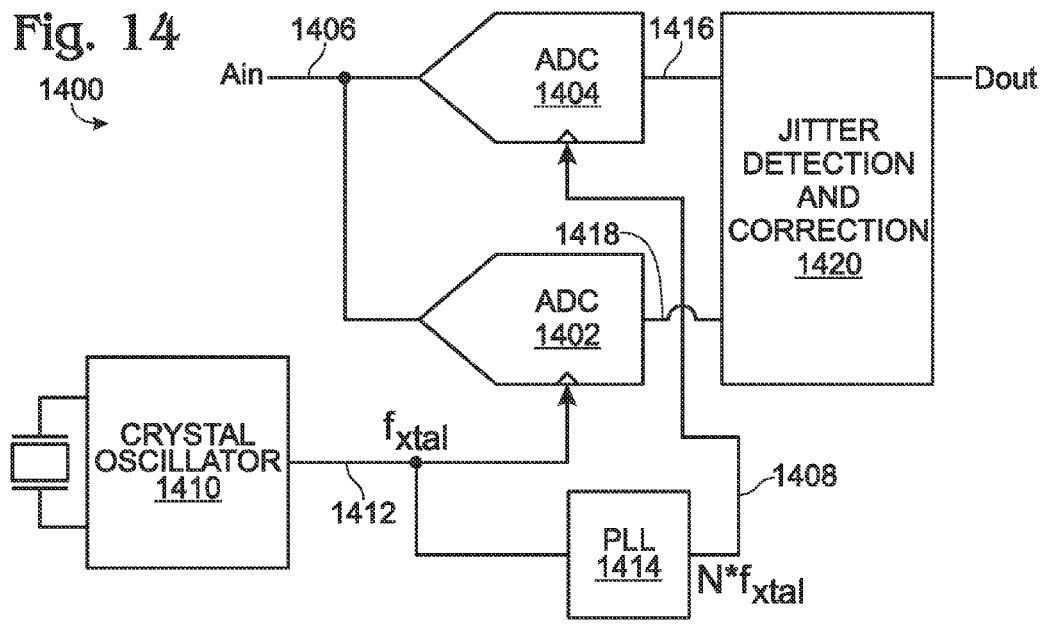
FIG. 14 is a schematic block diagram depicting a variation of the phase error correction system.

FIG. 14 is a schematic block diagram depicting a variation of the phase error correction system. In this system, two ADCs 1402 and 1404 sample the same analog input signal on line 1406. The main ADC 1404 is clocked with from PLL 1414 with a PLL clock on line 1408 and the second ADC 1402 with a crystal oscillator 1410 on line 1412. The PLL clock rate is N times the crystal oscillator reference signal frequency. The crystal oscillator reference signal has very little phase noise, and as a result, the digital samples out of the second ADC 1402 on line 1418 have very little error due to clock jitter. The PLL clock on line 1408 suffers from close-in phase noise which causes error in the data coming out of the main ADC 1404 on line 1416. Using the under-sampled clean data from the second ADC 1402 as a reference, the PLL clock jitter is estimated from the output of the main ADC 1404 and used to digitally correct the data by jitter detection and correction block 1420.

Figure 15:
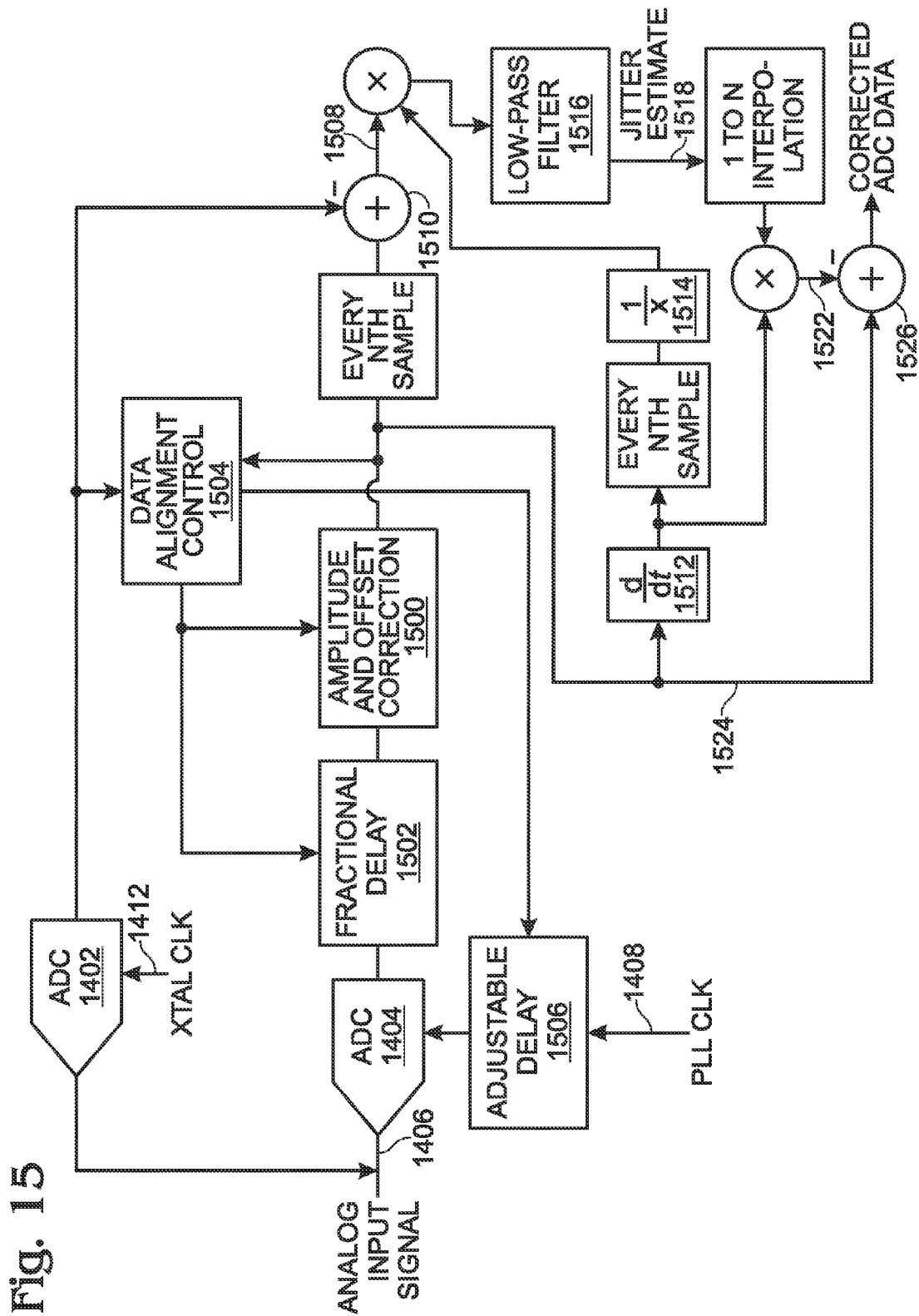
FIG. 15 is a schematic block diagram depicting an exemplary jitter detection and correction module, such as might be used in the system of FIG. 14.

FIG. 15 is a schematic block diagram depicting an exemplary jitter detection and correction module, such as might be used in the system of FIG. 14. First, the main ADC 1404 sampled data is aligned with the second ADC 1402 sampled data by adjusting its amplitude and offset at block 1500, and delay at block 1502, using data alignment control block 1504. The delay adjustment can be done by adjusting the delay of the XTAL reference clock (line 1412) in the analog domain (not shown) or by adjusting the delay of the PLL clock in the analog domain at block 1506. Alternatively as shown, the delay adjustment is performed digitally using fractional delay filter 1502 or done using extrapolation with the aid of the derivative of the signal (not shown).

Next, the reference signal from ADC 1402 is subtracted from the aligned output of the main ADC 1404 by subtractor 1510 to form the error signal on line 1508. The error signal is divided by the derivative of the analog input signal, using blocks 1512 and 1514, and low-pass filtered by block 1516 to get the jitter estimate on line 1518. The jitter estimate is updated every Nth clock of the main ADC 1404 and interpolation is used to obtain the values in between. The phase correction is identical to the one described above in the explanations of FIGS. 7 and 8. That is, the digitized data signal form ADC 1404 is corrected by multiplying the jitter estimate (phase error correction) by the derivative using multiplier 1520 to obtain the product on line 1522, and subtracting the product from the delayed digitized data signal on line 1524 at subtractor 1526 to obtain phase corrected digitized data signals.

Although not explicitly shown, the system of FIG. 14 may be implemented using a frequency source other than a crystal oscillator and a frequency multiplier other than a PLL. Further, the elements depicted in FIGS. 14 and 15 may be enabled in hardware, software, or with a combination of hardware and software.

Figure 17A:
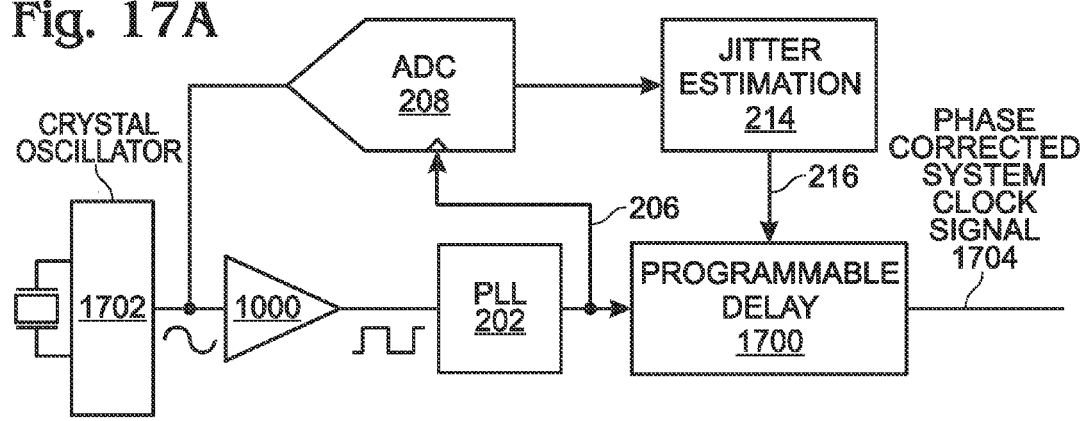
FIGS. 17A and 17B are schematic block diagrams of a system for correcting the phase error in the system clock signal.
Figure 17B:
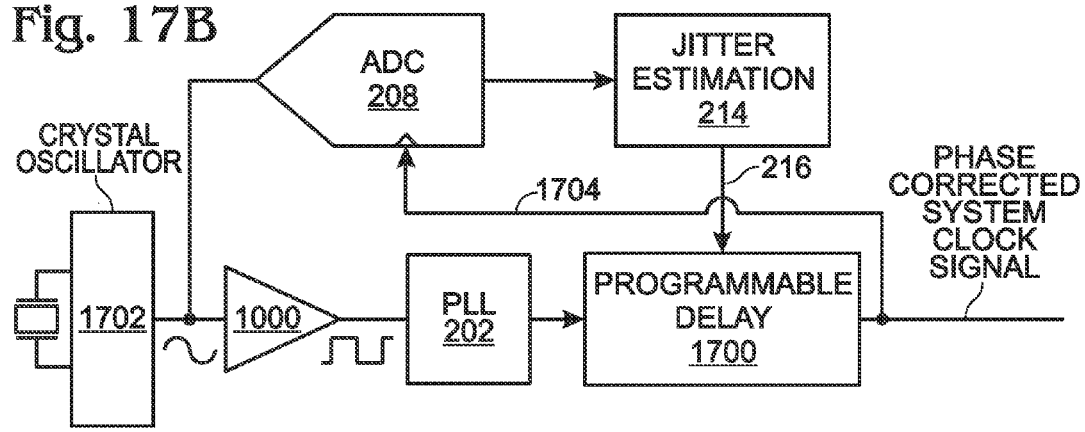

FIGS. 17A and 17B are schematic block diagrams of a system for correcting the phase error in the system clock signal. In these examples the analog reference signal is supplied by crystal oscillator 1702 and the frequency multiplier 202 is a PLL, but the systems are not limited to any particular type of frequency source or frequency multiplier. In FIG. 17A, a programmable delay 1700 has an input to accept the system clock signal on line 206 and an input on line 216 to accept the phase error correction. The programmable delay 1700 has a programmable delay responsive to the phase error correction, and an output on line 1704 to supply a phase corrected system clock signal. FIG. 17B is the same as 17A, except the system clock signal accepted by the first ADC 208 is the phase corrected system clock signal on line 1704. Note: when applying the phase error correction to the system clock signal, the correction is always late due to jitter estimation module processing, limiting the correction bandwidth that is possible. Having an ADC with a low latency and calculating the phase error correction using a minimum number of clock cycles can minimize this penalty. In contrast, the application of a feedforward phase error correction to the digitized data signal does not suffer from this limitation.

Figure 18:
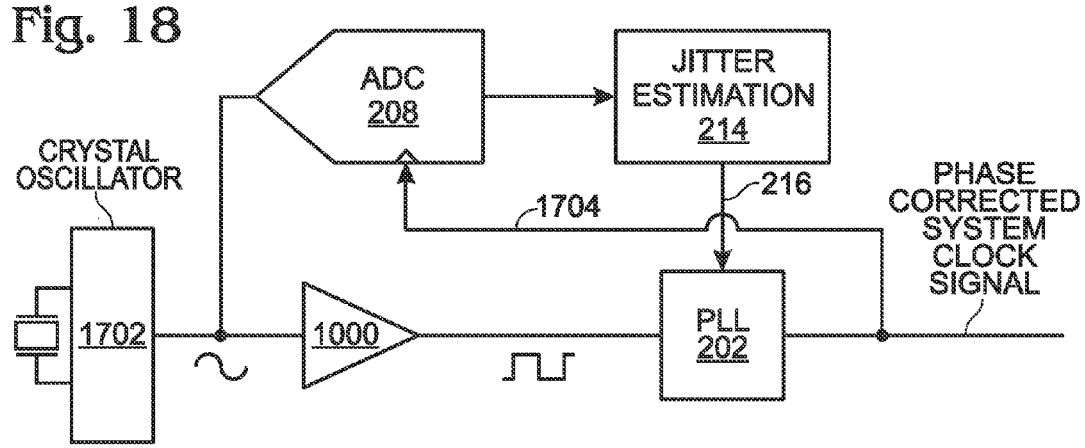
FIG. 18 is a schematic block diagram depicting an alternate system for correcting system clock signal phase error.

FIG. 18 is a schematic block diagram depicting an alternate system for correcting system clock signal phase error. In this system the system clock signal is the same as the phase corrected system clock signal. Again in this example the analog reference signal is supplied by crystal oscillator 1702 and the frequency multiplier 202 is a PLL, but the system is not limited to any particular type of frequency source or frequency multiplier. The clock input of the first ADC 208 accepts the phase corrected system clock signal on line 1704. The frequency multiplier has an input to accept the phase error correction on line 216 and an output to supply the phase corrected system clock signal on line 1704.

Figure 19A:
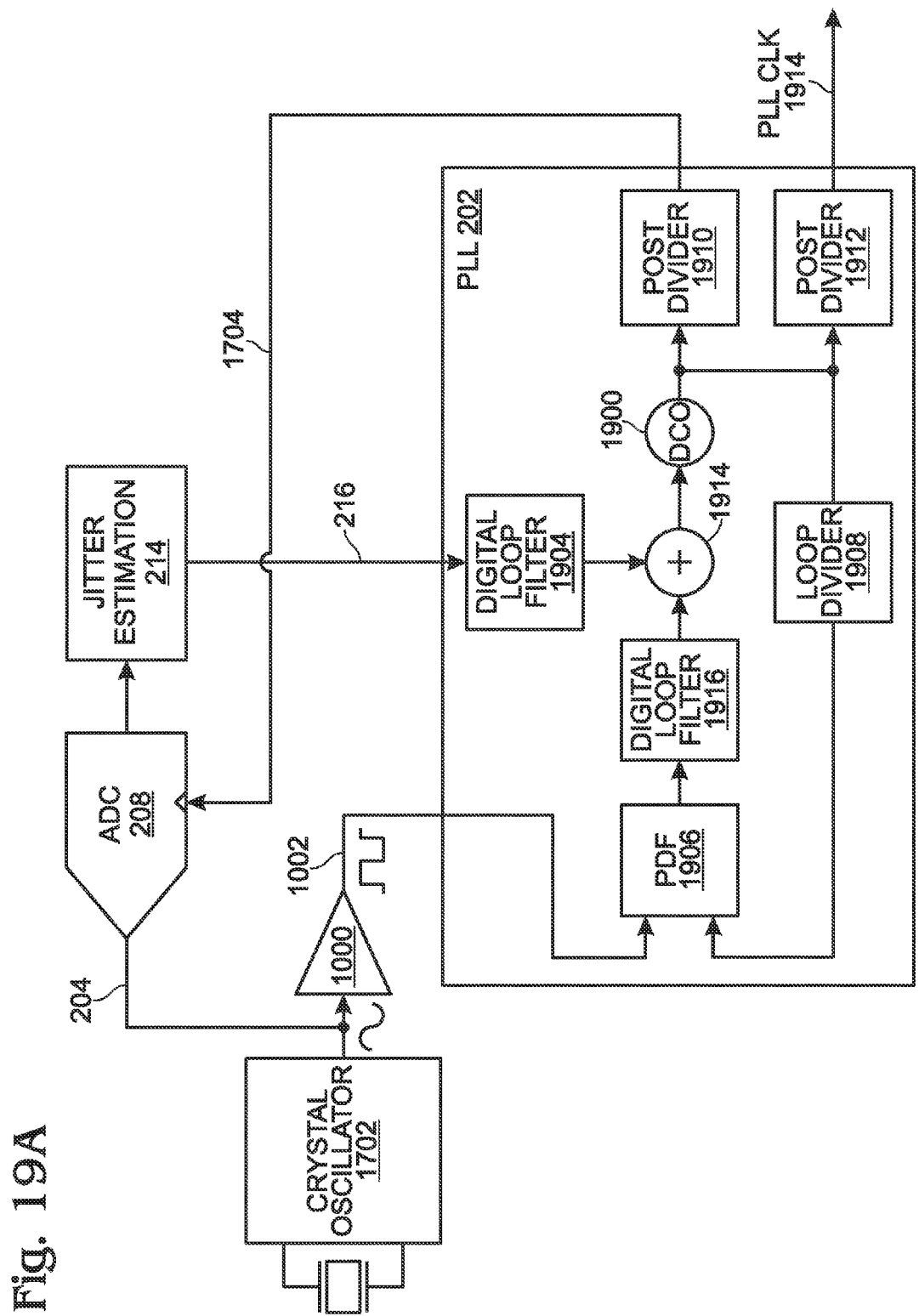
FIGS. 19A and 19B are schematic block diagrams depicting two examples of the system of FIG. 18 in greater detail.
Figure 19B:
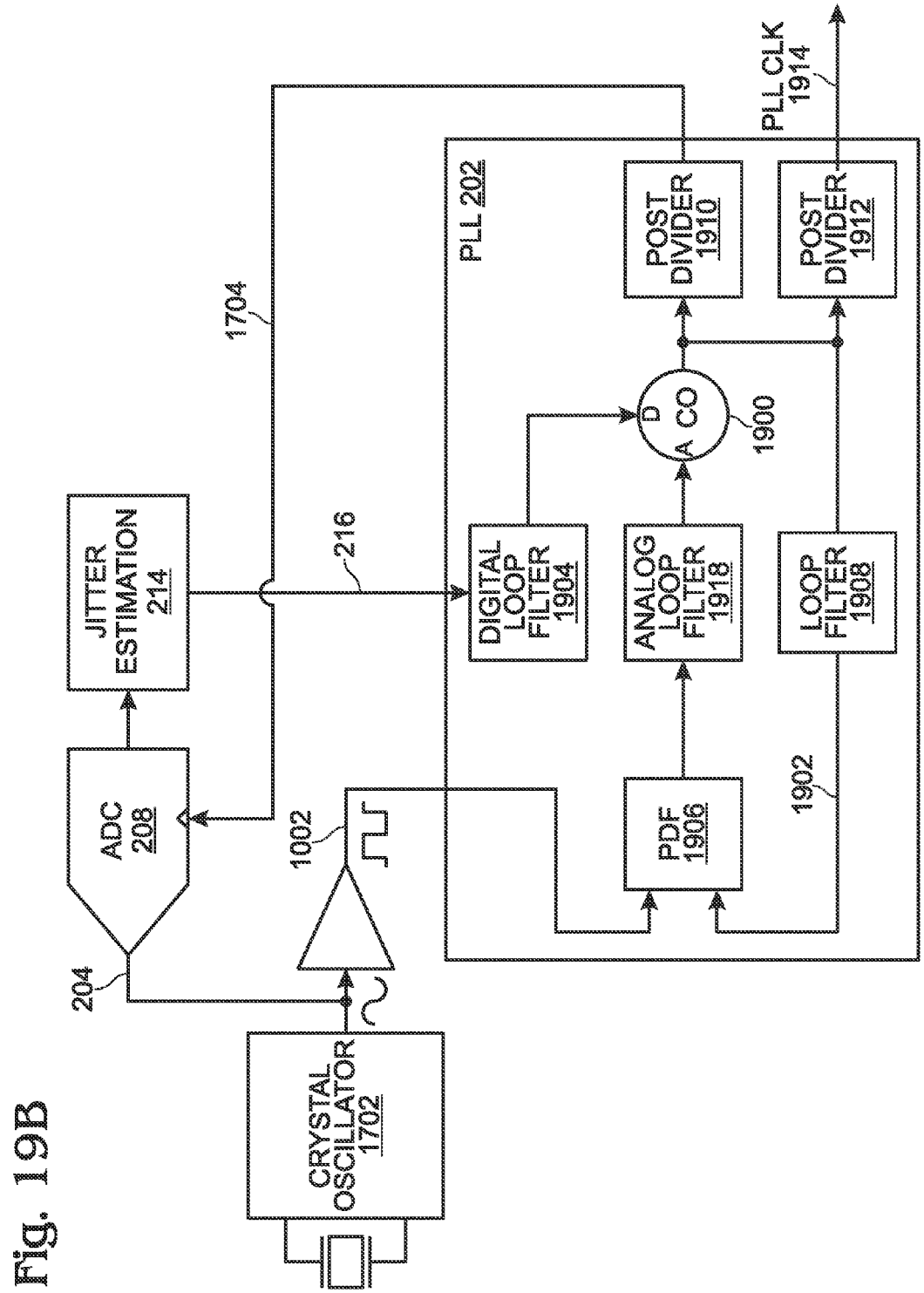

FIGS. 19A and 19B are schematic block diagrams depicting two examples of the system of FIG. 18 in greater detail. In short, the frequency multiplier (PLL) 202 comprises a system clock oscillator 1900 to create the phase corrected system clock signal on line 1704 in response to a combination of control signals derived from the phase error correction on line 216, system clock oscillator negative feedback on line 1902, and the analog reference signal on line 204, which is digitized on line 1002. Both examples include a digital loop filter 1904, a phase frequency detector (PFD) 1906, loop divider 1908, and post dividers 1910 and 1912. Post dividers 1910 and 1912 permit the generation of a PLL clock signal on line 1914 that has a different frequency that the phase corrected system clock signal on line 1704.

In FIG. 19A, the system clock oscillator 1900 is a digitally controlled oscillator (DCO), and summing device 1916 combines digital control signals from digital loop filter 1904 and digital loop filter 1916. Note: the digital control signal output by digital loop filter 1916 is responsive to the analog reference signal on line 204 and negative feedback on line 1902.

In FIG. 19B, the system clock oscillator 1900 is a controlled oscillator (CO) having a digital input (D) to accept a digital control signal from digital loop filter 1904 and an analog input (A) to accept an analog control signal from analog loop filter 1918. The analog control signal supplied by analog loop filter 918 is responsive to the analog reference signal on line 204 and negative feedback on line 1902.

Figure 16B:
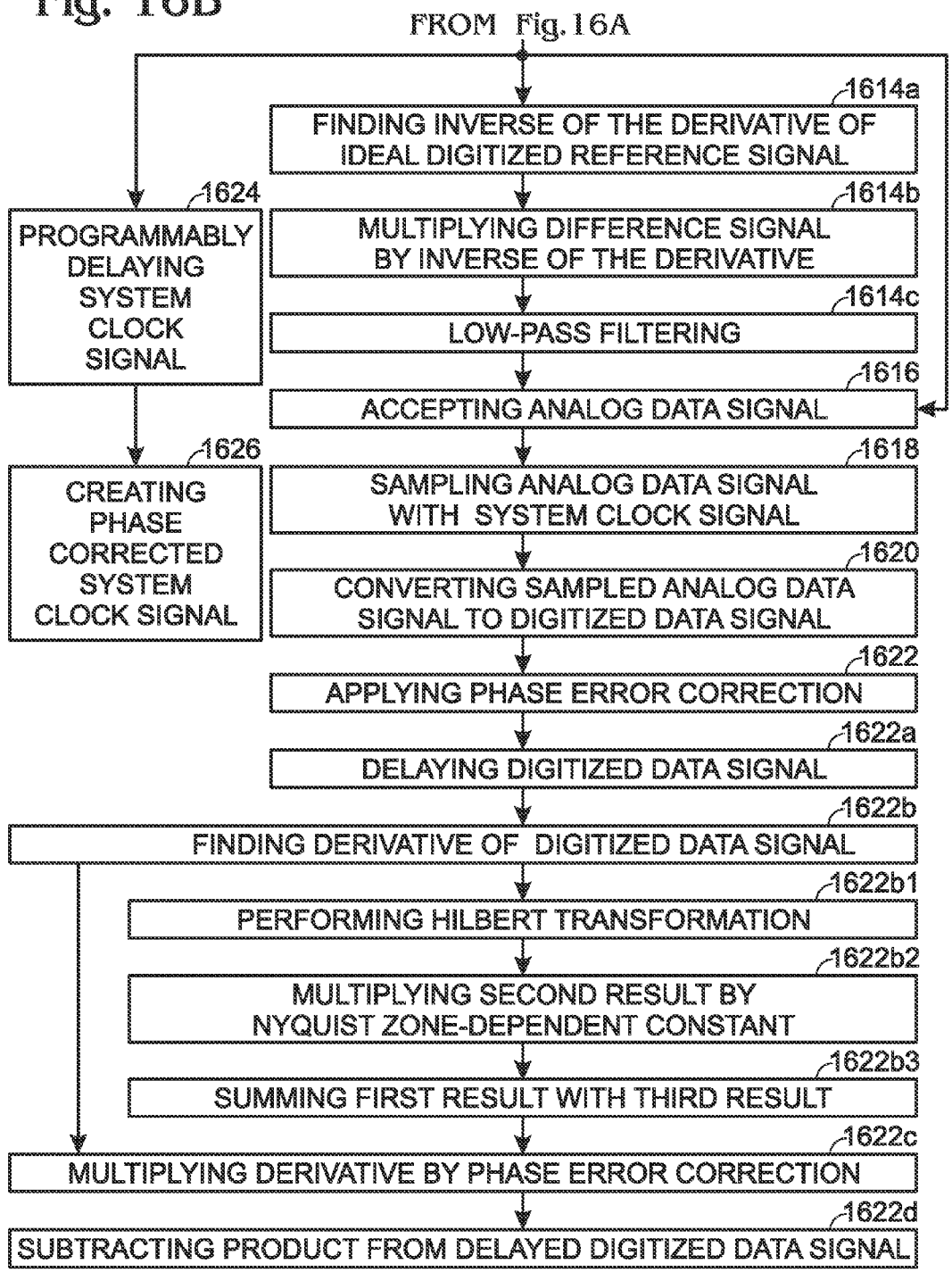

FIGS. 16A and 16B are flowcharts illustrating a method for frequency multiplication jitter correction. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1600.

Step 1602 accepts an analog reference signal having a first frequency. Using the analog reference signal, Step 1604 derives a system clock signal having a second frequency, greater than the first frequency. Step 1606 samples the amplitude of the analog reference signal using the system clock signal. Step 1608 converts the sampled analog reference signal into a digitized reference signal. In one aspect, Step 1610a collects samples of the digitized reference signal over a plurality of digitized reference signal periods, at a plurality period reference points, and Step 1610b low-pass filters the collected samples of the digitized reference signal period reference point samples to create an ideal digitized reference signal. Step 1612 compares the digitized reference signal to the ideal digitized reference signal. In response to the comparing, Step 1614 derives a phase error correction for the system clock signal.

In one aspect, Step 1614 derives a phase error correction at a first instance of time. Step 1616 accepts an analog data signal at the first instance of time. Step 1618 samples the amplitude of the analog data signal with a system clock signal. Step 1620 converts the sampled analog data signal into a digitized data signal. Step 1622 applies the phase error correction to the digitized data signal.

In one aspect, the determining of the phase error in Step 1612 and the applying of the phase error correction in Step 1622 occur over a duration of time no greater than a first duration of time. Then, Step 1622 comprises the following substeps. Step 1622a delays the digitized data signal the first duration of time to supply a delayed digitized data signal. Step 1622c applies the phase error correction to the delayed digitized data signal.

In another aspect, using the analog reference signal to derive the system clock signal having the second frequency in Step 1604 additionally includes using the analog reference signal to derive a system clock signal having a third frequency, different than the first and second frequencies. Then, sampling the analog reference signal using the system clock signal in Step 1606 includes sampling the analog reference signal with the system clock signal having the second frequency. Sampling the analog data signal with the system clock in Step 1618 includes sampling the analog data signal with the system clock signal having the third frequency.

In one aspect, Step 1601a generates a first input signal having the first frequency, and a second input signal having the first frequency and a constant phase offset with respect to the first input signal. Step 1601b compares the slope of the first input signal to the slope of the second input signal. Step 1601c determines the input signal having the greater slope. Then, accepting the analog reference signal in Step 1602 includes accepting the input signal having the greater slope as the analog reference signal.

In another aspect, comparing the digitized reference signal to the ideal digitized reference signal in Step 1612 includes subtracting the ideal digitized reference signal from the digitized reference signal to supply a difference signal. Then, deriving the phase error correction in Step 1614 comprises the following substeps. Step 1614a finds the inverse of the derivative of the ideal digitized reference signal. Step 1614b multiplies the difference signal by the inverse of the derivative. Alternatively stated, Step 1614b divides the difference signal by the derivative of the ideal digitized reference signal. In one variation, Step 1614c performs a low-pass filtering operation subsequent to Step 1614b.

In one aspect, applying the phase error correction to the delayed digitized data signal comprises the following additional substeps. When the analog data signal is inside the first Nyquist zone, Step 1622b finds the derivative of the delayed digitized data signal. Step 1622c multiplies the derivative of the delayed digitized data signal by the phase error correction to supply a product. Step 1622d subtracts the product from the delayed digitized data signal. When the analog data signal is outside of the first Nyquist zone, Step 1622b finds the derivative of the delayed digitized data signal to supply a first result. Step 1622b1 performs a Hilbert transformation on the delayed digitized data signal to supply a second result. Step 1622b2 multiplies the second result by a Nyquist zone-dependent constant to supply a third result. Step 1622b3 sums the first result with the third result to supply the product.

In one aspect, Step 1624 delays the system clock signal a duration of time equal to a programmable delay responsive to the phase error correction. Step 1626 creates a phase corrected system clock signal. In one variation, Step 1606 samples the amplitude of the analog reference signal using a phase corrected system clock signal instead of with the system clock signal.

In another aspect, Step 1606 samples the amplitude of the analog reference signal using a phase corrected system clock, and Step 1604 derives the system clock with the following substeps. Step 1604a controls a system clock oscillator in response to a combination of control signals derived from system clock oscillator negative feedback, the analog reference signal, and the phase error correction. Step 1604b creates the phase corrected system clock signal.

A system and method have been provided for the correction of frequency multiplier phase errors. Particular process steps and hardware circuits have been presented as examples to explain the system and methods, but the systems and methods are not necessarily limited by these examples. Further, although crystal oscillators and PLLs have been explicitly depicted as examples of, respectively, a frequency source and a frequency multiplier, the systems and methods are not limited to these examples. Other variations and modifications of the above-described systems and methods will likely occur to those skilled in the art.

We claim:

1. A method for frequency multiplication jitter correction, the method comprising:
   accepting an analog reference signal having a first frequency;
   using the analog reference signal, deriving a first system clock signal having a second frequency, greater than the first frequency;
   sampling an amplitude of the analog reference signal using the first system clock signal;

converting the sampled analog reference signal into a digitized reference signal;

collecting samples of the digitized reference signal over a plurality of digitized reference signal periods, at a plurality period reference points;

low-pass filtering the collected samples of the digitized reference signal period reference point samples to create an ideal digitized reference signal;

comparing the digitized reference signal at a first instance of time to the ideal digitized reference signal; and, in response to the comparing, deriving a phase error correction for the first system clock signal at the first instance of time.

2. The method of claim 1 further comprising:

accepting an analog data signal at the first instance of time;

sampling an amplitude of the analog data signal using a derived system clock signal;

converting the sampled analog data signal into a digitized data signal; and, applying the phase error correction to the digitized data signal.

3. The method of claim 2 wherein the steps of deriving the phase error correction and applying the phase error correction occur over a duration of time no greater than a first duration of time; and, wherein applying the phase error correction to the digitized data signal further comprises:

delaying the digitized data signal the first duration of time to supply a delayed digitized data signal; and, applying the phase error correction to the delayed digitized data signal.

4. The method of claim 3 wherein applying the phase error correction to the delayed digitized data signal comprises:

when the analog data signal is inside a first Nyquist zone, finding a derivative of the delayed digitized data signal;

multiplying the derivative of the delayed digitized data signal by the phase error correction to supply a product; and, subtracting the product from the delayed digitized data signal.

5. The method of claim 4 wherein finding the derivative of the delayed digitized data signal comprises:

when the analog data signal is outside of a first Nyquist zone, finding the derivative of the delayed digitized data signal to supply a first result;

performing a Hilbert transformation on the delayed digitized data signal to supply a second result;

multiplying the second result by a Nyquist zone-dependent constant to supply a third result;

summing the first result with the third result to supply a product; and, subtracting the product from the delayed digitized data signal.

6. The method of claim 2 wherein using the analog reference signal to derive the first system clock signal having the second frequency additionally includes using the analog reference signal to derive a second system clock signal having a third frequency, different than the first and second frequencies; and, wherein sampling the analog data signal using the derived system clock includes sampling the analog data signal with the second system clock signal having the third frequency.

7. The method of claim 1 further comprising:

generating a first input signal having the first frequency, and a second input signal having the first frequency and a constant phase offset with respect to the first input signal;

comparing a slope of the first input signal to a slope of the second input signal;

determining the input signal having the greater slope; and, wherein accepting the analog reference signal includes accepting the input signal having the greater slope as the analog reference signal.

8. The method of claim 1 wherein comparing the digitized reference signal to the ideal digitized reference signal includes subtracting the ideal digitized reference signal from the digitized reference signal to supply a difference signal; and, wherein deriving the phase error correction comprises:

finding an inverse of a derivative of the ideal digitized reference signal; and, multiplying the difference signal by the inverse of the derivative.

9. The method of claim 8 wherein deriving the phase error correction further comprises, subsequent to multiplying the difference signal by the inverse of the derivative, low-pass filtering.

10. The method of claim 1 further comprising:

delaying the system clock signal a duration of time equal to a programmable delay responsive to the phase error correction; and, creating a phase corrected system clock signal.

11. A system for frequency multiplier jitter correction, the system comprising:

a frequency multiplier with an input to accept an analog reference signal having a first frequency and an output to supply a derived first system clock signal having a second frequency, greater than the first frequency;

a first analog-to-digital converter (ADC) having a signal input to accept the analog reference signal, a clock input to accept the first system clock signal, and an output to supply a digitized reference signal in response to sampling an amplitude of the analog reference signal using the first system clock signal;

a low-pass filter bank with an input to accept the digitized reference signal, the low-pass filter bank sampling the digitized reference signal over a plurality of digitized reference signal periods, at a plurality of period reference points, and supplying an ideal digitized reference signal at an output; and, a jitter estimation module having an input to accept the digitized reference signal, the jitter estimation module comparing the digitized reference signal at a first instance of time to the ideal digitized reference signal, and in response to the comparing, determining a phase error in the system clock signal at the first instance of time.

12. The system of claim 11 further comprising:

a jitter correction module having a first input to accept a digitized data signal and a second input to accept the phase error correction;

a second ADC having a signal input to accept an analog data signal at the first instance of time, a clock input to accept a derived system clock signal, and an output to supply the digitized data signal in response to sampling an amplitude of the analog data signal with the derived system clock signal; and, wherein the jitter correction module applies the phase error correction to the digitized data signal and supplies a phase corrected digitized data signal at an output.

13. The system of claim 12 wherein the frequency multiplier additionally supplies a second system clock signal having a third frequency, different than the first and second frequencies, derived from the analog reference signal; and,
wherein the second ADC samples the analog data signal with the second system clock having the third frequency.

14. The system of claim 11 wherein the jitter estimation module supplies the phase error correction within a duration of time no greater than a first processing time;
wherein the jitter correction module applies the phase error correction within a duration of time no greater than a second processing time, the jitter correction module further comprising:
a delay having an input to accept the digitized data signal and an output supply a delayed digitized data signal, delayed a first duration of time equal to the sum of the first and second processing times; and,
wherein jitter correction module applies the phase error correction to the delayed digitized data signal.

15. The system of claim 14 wherein the jitter correction module further comprises:
a derivative module comprising:
when the analog data signal is within a first Nyquist zone, a derivative filter having an input to accept the delayed digitized data signal and an output to supply a derivative of the delayed digitized data signal;
a second multiplier having an input to accept the derivative of the delayed digitized data signal, an input to accept the phase error correction, and an output to supply a product; and,
a second subtractor having an input to accept the delayed digitized data signal, an input to accept the product for subtraction from the delayed digitized data signal, and an output to supply the phase corrected digitized data signal.

16. The system of claim 15 wherein the derivative filter supplies a first result at the output when the analog data signal is outside of a first Nyquist zone;
wherein the derivative module further comprises:
a Hilbert transformer having an input to accept the delayed digitized data signal and an output to supply a second result;
a third multiplier having an input to accept the second result, an input to accept a Nyquist zone-dependent constant, and an output to supply a third result; and,
a summing circuit having an input to accept the first result, an input to accept the third result, and an output to supply the derivative of the delayed digitized data signal.

17. The system of claim 11 further comprising:
a frequency source with a first output to supply a first signal having the first frequency, and a second output to supply a second signal having the first frequency and a constant phase offset with respect to the first signal;
a multiplexer (MUX) having signal inputs connected to the first and second outputs of the frequency source, and a control input to accept a maximum slope control signal, the MUX having an output to supply the input signal having a greater slope as the analog reference signal in response to the maximum slope control signal; and,
a slope detector having an input connected to the MUX output, the slope detector sampling a slope of the first signal over a plurality of first signal periods, sampling a slope of the second signal over a plurality of second signal periods, comparing the collected samples of the first and second signal slopes, determining the signal having the greater slope at a plurality period reference points, and supplying the maximum slope control signal at an output.

18. The system of claim 11 wherein the frequency multiplier is a device selected from a group consisting of a phase-locked loop (PLL) and a delay-locked loop (DLL).

19. The system of claim 11 further comprising:
a frequency source having an output to supply the analog reference signal, the frequency source being a device selected from a group consisting of a crystal oscillator (XO) and a microelectromechanical system (MEMS) oscillator.

20. The system of claim 11 wherein the jitter estimation module further comprises:
a first memory to supply the ideal digitized reference signal from storage;
a first subtractor having an input to accept the ideal digitized reference signal from the first memory, an input to accept the digitized reference signal, and an output to supply a difference signal;
a second memory to supply an inverse of a derivative of the ideal digitized reference signal from storage; and,
a first multiplier with an input to accept the difference signal, an input to accept the inverse of the derivative of the ideal digitized reference signal from the second memory, and an output to supply the phase error correction.

21. The system of claim 20 wherein the jitter estimation module further comprises:
a low-pass filter having an input connected to the output of the first multiplier and an output to supply a low-pass filtered phase error correction.

22. The system of claim 11 further comprising:
a programmable delay having an input to accept the system clock signal and an input to accept the phase error correction, the programmable delay having a programmable delay responsive to the phase error correction, and an output to supply a phase corrected system clock signal.

23. A system for frequency multiplier jitter correction, the system comprising:
a first analog-to-digital converter (ADC) having a signal input to accept an analog reference signal having a first frequency, a clock input to accept a phase corrected system clock signal, and an output to supply a digitized reference signal in response to sampling an amplitude of the analog reference signal using the phase corrected system clock signal; and,
a jitter estimation module having an input to accept the digitized reference signal, the jitter estimation module comparing the digitized reference signal at a first instance of time to a digitized reference signal integrated over a plurality if digitized reference signal periods, and in response to the comparing, determining a phase error in the phase corrected system clock signal at the first instance of time.

24. The system of claim 23 further comprising:
a programmable delay having an input to accept a system clock signal and an input to accept a phase error correction, the programmable delay having a programmable delay responsive to the phase error correction, and an output to supply the phase corrected system clock signal.

* * * * *